United States Patent
Yen

(10) Patent No.: US 7,750,881 B2
(45) Date of Patent: *Jul. 6, 2010

(54) VOLTAGE CONVERSION DEVICE HAVING NON-LINEAR GAIN

(75) Inventor: Chih-Jen Yen, Hsinchu (TW)

(73) Assignee: NOVATEK Microelectronics Corp., Hsinchu Science Park, Hsin-Chu (TW)

(*) Notice: Subject to any disclaimer, the term of this patent is extended or adjusted under 35 U.S.C. 154(b) by 714 days.

This patent is subject to a terminal disclaimer.

(21) Appl. No.: 11/671,466

(22) Filed: Feb. 6, 2007

(65) Prior Publication Data

US 2008/0094267 A1 Apr. 24, 2008

(30) Foreign Application Priority Data

Oct. 19, 2006 (TW) .............................. 95138601 A

(51) Int. Cl.
*G09G 3/36* (2006.01)

(52) U.S. Cl. .................... 345/95; 345/96; 345/209; 345/210; 341/142; 341/155

(58) Field of Classification Search ........... 345/87–100, 345/204–215, 699; 341/120–155
See application file for complete search history.

(56) References Cited

U.S. PATENT DOCUMENTS

| | | | | |
|---|---|---|---|---|
| 6,414,619 B1* | 7/2002 | Swanson | ..................... | 341/155 |
| 6,566,905 B2* | 5/2003 | Sanzo et al. | .................. | 326/37 |
| 6,707,492 B1* | 3/2004 | Itani | ........................ | 348/229.1 |
| 7,365,666 B1* | 4/2008 | Yen | ............................. | 341/142 |

FOREIGN PATENT DOCUMENTS

| | | |
|---|---|---|
| JP | S6370618 | 3/1988 |
| JP | H03101033 | 10/1991 |
| JP | H04360315 | 12/1992 |
| JP | H06188661 | 7/1994 |
| JP | H11298270 | 10/1999 |
| JP | 20025742 | 1/2002 |
| TW | 200419901 | 10/2004 |
| TW | 200605494 | 2/2006 |

* cited by examiner

*Primary Examiner*—Vijay Shankar
(74) *Attorney, Agent, or Firm*—Winston Hsu

(57) ABSTRACT

A voltage conversion device has a non-linear gain, for converting analog voltage provided by an analog voltage source. The voltage conversion device comprises a gain decision module, a voltage selection module, and a voltage output module. The gain decision module comprises an analog to digital (A/D) converter and a gain selector. The A/D converter is used for converting analog voltage provided by the analog voltage source into digital signals. The gain selector is used for determining a gain. The voltage selection module is used for outputting a direct-current (DC) voltage. The voltage output module has a first input end coupled to the gain selector, an output end coupled to the gain selector, and a second input end coupled to the voltage selection module, for outputting an amplified result of the DC voltage outputted from the voltage selection module.

42 Claims, 30 Drawing Sheets

| D1 D0 | Selected resistor |
|---|---|
| 0 0 | R(1) |
| 0 1 | R(2) |
| 1 0 | R(3) |
| 1 1 | R(4) |

Fig. 18

| | Selected resistor |
|---|---|
| D(1) Enabled | R(1) |
| D(2) Enabled | R(2) |
| D(3) Enabled | R(3) |
| D(4) Enabled | R(4) |

Fig. 20

| POL | D1 | D0 | Selected DC voltage | Selected resistor |
|---|---|---|---|---|
| 0 | 0 | 0 | Vdc(1)b | R(1) |
| 1 | 0 | 0 | Vdc(1) | R(1) |
| 0 | 0 | 1 | Vdc(2)b | R(2) |
| 1 | 0 | 1 | Vdc(2) | R(2) |
| 0 | 1 | 0 | Vdc(3)b | R(3) |
| 1 | 1 | 0 | Vdc(3) | R(3) |
| 0 | 1 | 1 | Vdc(4)b | R(4) |
| 1 | 1 | 1 | Vdc(4) | R(4) |

Fig. 22

| POL | | Selected DC voltage | Selected resistor |
|---|---|---|---|
| 0 | D(1) Enabled | Vdc(1)b | R(1) |
| 1 | D(1) Enabled | Vdc(1) | R(1) |
| 0 | D(2) Enabled | Vdc(2)b | R(2) |
| 1 | D(2) Enabled | Vdc(2) | R(2) |
| 0 | D(3) Enabled | Vdc(3)b | R(3) |
| 1 | D(3) Enabled | Vdc(3) | R(3) |
| 0 | D(4) Enabled | Vdc(4)b | R(4) |
| 1 | D(4) Enabled | Vdc(4) | R(4) |

Fig. 24

VOLTAGE CONVERSION DEVICE HAVING NON-LINEAR GAIN

BACKGROUND OF THE INVENTION

1. Field of the Invention

The present invention relates to a voltage conversion device, and more particularly, to a voltage conversion device having a non-linear gain.

2. Description of the Prior Art

A liquid crystal display (LCD) monitor has characteristics of light shape, low power consumption, zero radiation, etc. and has been widely used in many information technology (IT) products, such as computer systems, mobile phones, and personal digital assistants (PDAs). The operating principle of the LCD is based on the fact that liquid crystals in different twist status can result in different polarization and refraction effects on light. Thus, the liquid crystals can control penetration amount of light by arranging in different twist status, so as to produce various brightness of light output and diverse gray levels of red, green and blue lights.

Please refer to FIG. 1. FIG. 1 is a schematic diagram of a thin-film-transistor (TFT) LCD monitor 10 according to the prior art. The LCD monitor 10 includes an LCD panel 100, a control circuit 102, a data-line-signal output circuit 104, a scan-line-signal output circuit 106, and a voltage generator 108. The LCD panel 100 is formed with two substrates, and LCD layers are stuffed between the substrates. One substrate includes a plurality of data lines 110, a plurality of scan lines (or gate lines) 112 perpendicular to the data lines 110, and a plurality of TFTs 114. The other substrate includes a common electrode for providing a common voltage Vcom generated by the voltage generator 108. For the sake of brevity, FIG. 1 reveals only four TFTs 114, but in a real case, there is one TFT 114 set at each intersection of a data line 110 and a scan line 112 on the LCD panel 100. In other words, the plurality of TFTs 114, each corresponding to a pixel, form a matrix on the LCD panel 100, and the data lines 110 and the scan lines 112 are corresponding to columns and rows of the matrix. In addition, a circuit effect resulted from the two substrates of the LCD panel 100 can be regarded as equivalent capacitors 116.

A driving process of the prior art TFT LCD monitor 10 is described in details as follows. When the control circuit 102 receives a horizontal synchronization signal 118 and a vertical synchronization signal 120, the control circuit 102 generates corresponding control signals for the data-line-signal output circuit 104 and the scan-line-signal output circuit 106. The data-line-signal output circuit 104 and the scan-line-signal output circuit 106 generate input signals for the data lines 110 and the scan lines 112 according to the control signals, in order to control the TFTs 114 and voltage differences of the equivalent capacitors 116. The voltage differences change twist of liquid crystals and corresponding penetration amount of light so as to display the display data 122 on a panel. For example, the scan-line-signal output circuit 106 outputs a pulse wave for turning on a TFT 114, and signals of a corresponding data line 110 outputted from the data-line-signal output circuit 104 can pass through the TFT 114 to a corresponding equivalent capacitor 116, so as to control a gray level of corresponding pixel. Besides, signal level of the signals on the data line 110 outputted from the data-line-signal output circuit 104 drives a gray level of corresponding pixel.

In the prior art, in order to reduce EMI and save power under high-frequency operations, a voltage swing outputted from the display data 122 is basically very small, i.e., 0.1V~1V. Therefore, signals inputted to the data-line-signal output circuit 104 pass through a voltage conversion circuit, which adjusts voltage swings of the inputted signals to a predetermined range, so as to control chrominance and luminance of corresponding pixels. For example, please refer to FIG. 2. FIG. 2 is a schematic diagram of a voltage conversion circuit 20 according to the prior art. The voltage conversion circuit 20 includes an operational amplifier 200 and resistors 202, 204. The operational amplifier 200 has an input end 206 coupled to an output end of the display data 122, and an output end 208 coupled to an input end of the data-line-signal output circuit 104. As those skilled in the art recognized, if the operational amplifier 200 is an ideal operational amplifier having an infinite gain while the resistance of the resistors 202, 204 are R1 and R2, the gain of the voltage conversion circuit 20 is (1+R2/R1). In other words, the input and output voltages of the voltage conversion circuit 20 relates to a linear function.

Therefore, data signals outputted from the display data 122 are amplified via the voltage conversion circuit 20 and then are outputted to the data-line-signal output circuit 104. Under this circumstance, data-line signals outputted from the data-line-signal output circuit 104 are amplified to an operating range of the TFTs 114 via the prior art voltage conversion circuit 20, so that gray level and brightness revealed on the TFT LCD monitor 10 approximately relates to a linear line. Therefore, in the prior art, this effects color gradient of images, resulting in unnatural images.

SUMMARY OF THE INVENTION

Therefore, it is an object of the present invention to provide a voltage conversion device having a non-linear gain.

The present invention discloses a voltage conversion device having a non-linear gain for converting analog voltage provided by an analog voltage source. The voltage conversion device comprises a gain decision module, a voltage selection module, and a voltage output module. The gain decision module comprises an analog to digital (A/D) converter coupled to the analog voltage source, for converting analog voltage provided by the analog voltage source into digital signals, and a gain selector coupled to the A/D converter, for determining a gain according to the digital signals outputted from the A/D converter. The voltage selection module is coupled to the analog voltage source and the A/D converter, for outputting a direct-current (DC) voltage selected from a plurality of DC voltages according to analog voltage provided by the analog voltage source and the digital signals outputted from the A/D converter. And the voltage output module has a first input end coupled to the gain selector, an output end coupled to the gain selector, and a second input end coupled to the voltage selection module. The voltage output module is used for outputting an amplified result of the DC voltage outputted from the voltage selection module according to the gain determined by the gain selector.

The present invention further discloses a voltage conversion device having a non-linear gain for converting analog voltage provided by an analog voltage source. The voltage conversion device comprises a gain decision module, a voltage reception module, a voltage selection module, and a voltage output module. The gain decision module comprises an analog to digital (A/D) converter coupled to the analog voltage source, for converting analog voltage provided by the analog voltage source into digital signals, and a gain selector coupled to the A/D converter, for determining a gain according to the digital signals outputted from the A/D converter. The voltage reception module is used for receiving analog voltage provided by the analog voltage source and outputting the analog voltage after transforming a polarity of the analog voltage according to a polarity-selection signal. The voltage selection module is coupled to the voltage reception module and the A/D converter, for outputting a direct-current (DC) voltage selected from a plurality of DC voltages according to an outputted voltage of the voltage reception module, the digital signals outputted from the A/D converter, and the polarity-selection signal. The voltage output module has a first input end coupled to the gain selector, an output end coupled to the gain selector, and a second input end coupled to the voltage selection module. The voltage output module is used for outputting an amplified result of the DC voltage outputted from the voltage selection module according to the gain determined by the gain selector.

The present invention further discloses a voltage conversion device having a non-linear gain for converting analog voltage provided by an analog voltage source. The voltage conversion device comprises a gain decision module and a voltage output module. The gain decision module comprises an analog to digital (A/D) converter coupled to the analog voltage source, for converting analog voltage provided by the analog voltage source into digital signals, and a gain selector coupled to the A/D converter, for determining a gain according to the digital signals outputted from the A/D converter. The voltage output module has a first input end coupled to the gain selector, an output end coupled to the gain selector, and a second input end coupled to the analog voltage source. The voltage output module is used for outputting an amplified result of analog voltage provided by the analog voltage source according to the gain determined by the gain selector.

The present invention further discloses a voltage conversion device having a non-linear gain, for converting analog voltage provided by an analog voltage source. The voltage conversion device comprises a gain decision module, a voltage reception module, and a voltage output module. The gain decision module comprises an analog to digital (A/D) converter coupled to the analog voltage source, for converting analog voltage provided by the analog voltage source into digital signals, and a gain selector coupled to the A/D converter, for determining a gain according to the digital signals outputted from the A/D converter. The voltage reception module is used for receiving analog voltage provided by the analog voltage source and outputting the analog voltage after transforming a polarity of the analog voltage according to a polarity-selection signal. The voltage output module has a first input end coupled to the gain selector, an output end coupled to the gain selector, and a second input end coupled to the voltage reception module. The voltage output module is used for outputting an amplified result of the analog voltage outputted from the voltage receive module according to the gain determined by the gain selector.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 18 is a truth table of the gain selector according to FIG. 17.
FIG. 20 is a truth table of the gain selector according to FIG. 19.
FIG. 22 is a truth table of the voltage selection module according to FIG. 21.
FIG. 24 is a truth table of the voltage selection module according to FIG. 23.

DETAILED DESCRIPTION

Figure 1:
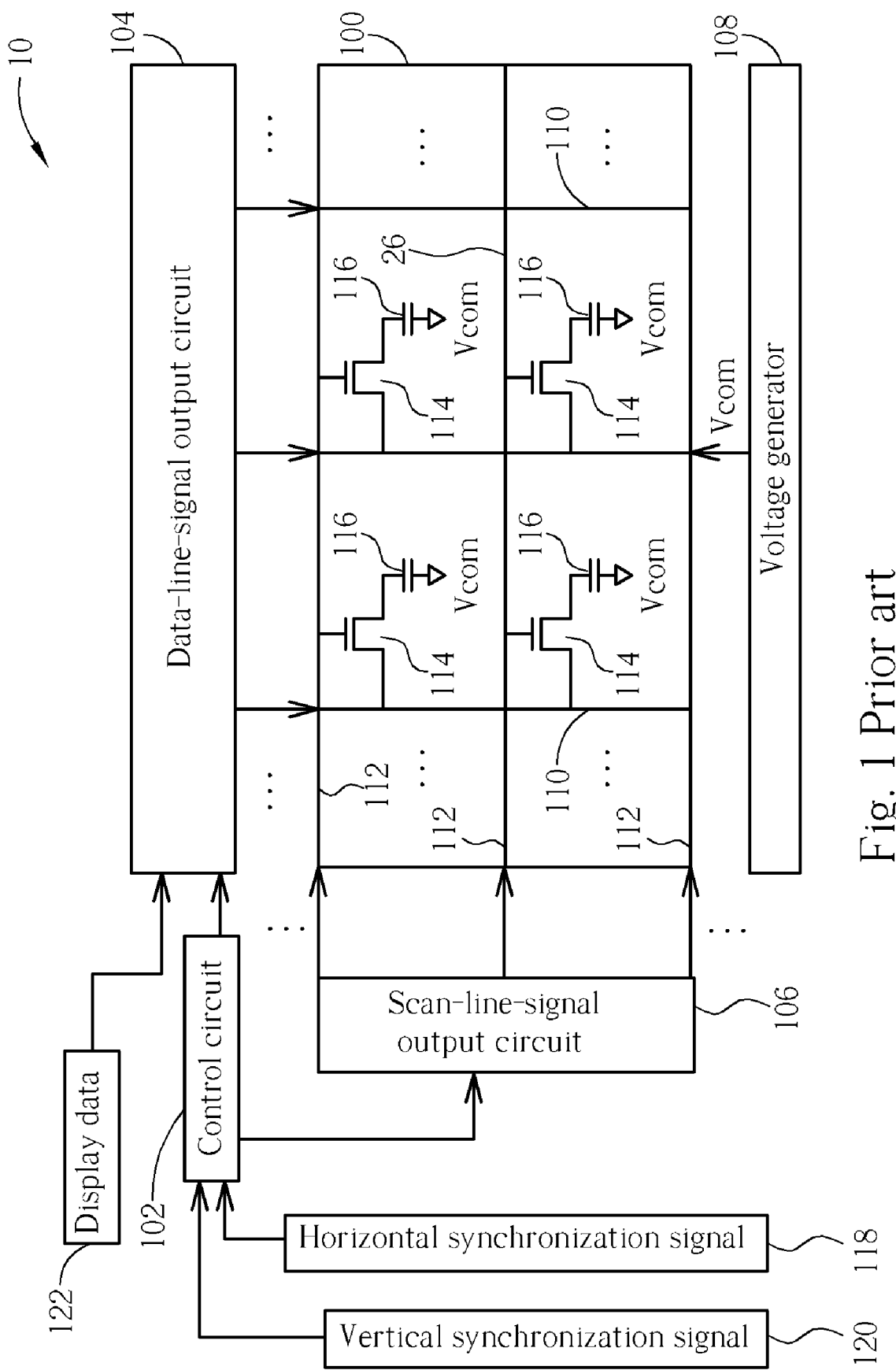
FIG. 1 is a schematic diagram of a thin-film-transistor (TFT) LCD according to the prior art.
Figure 2:
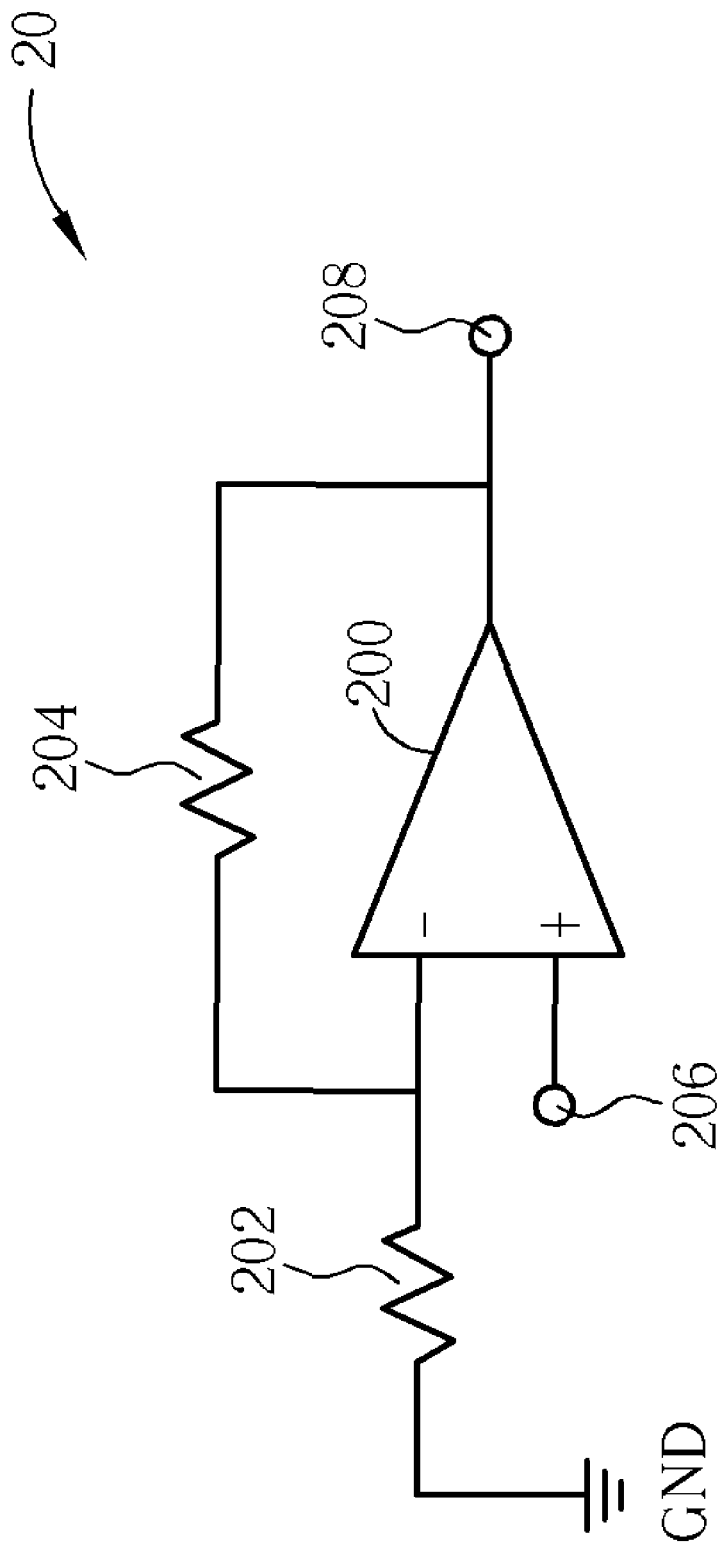
FIG. 2 is a schematic diagram of a voltage conversion circuit according to the prior art.
Figure 3:
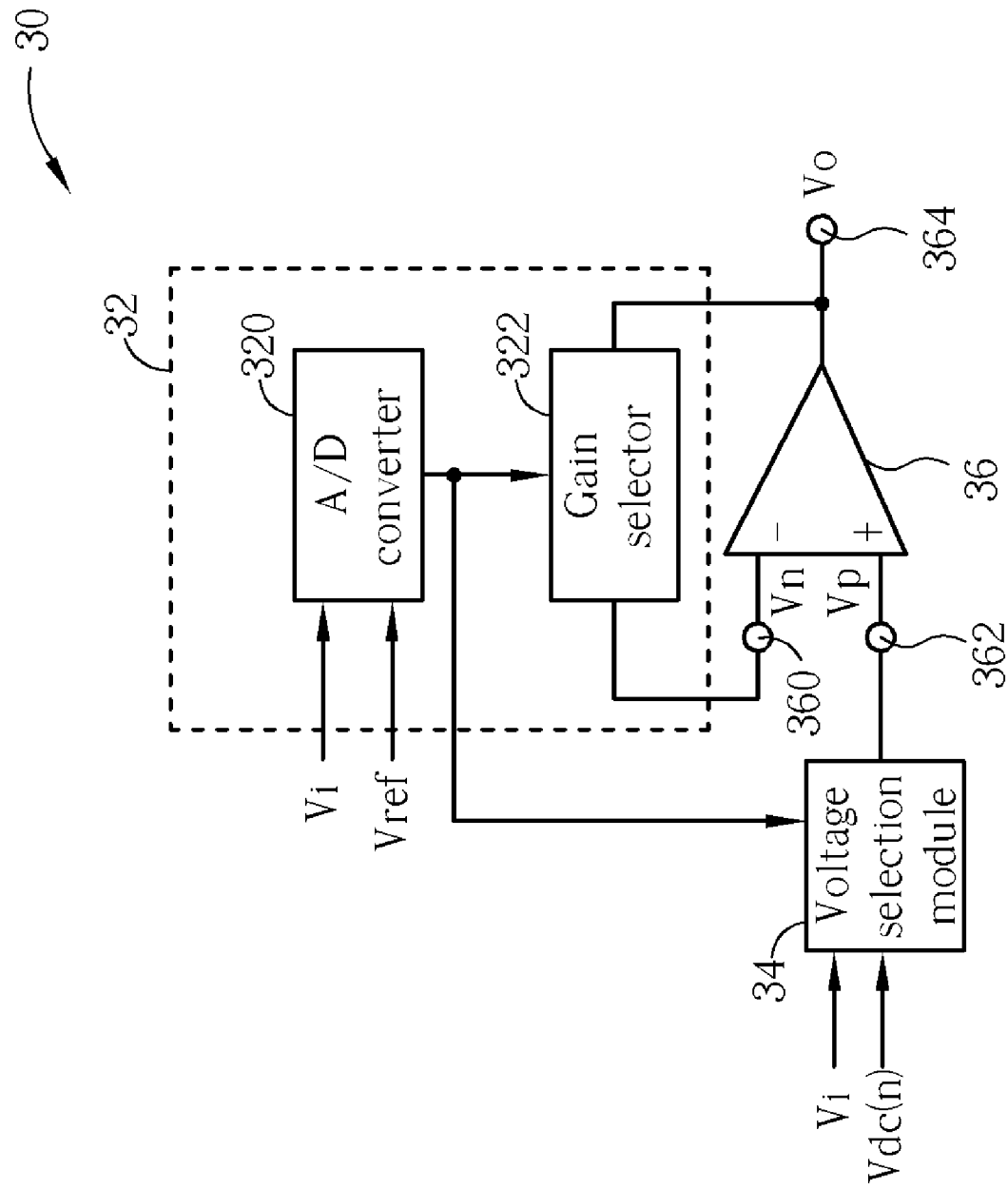
FIG. 3 is a schematic diagram of a voltage conversion device according to an embodiment of the present invention.

Please refer to FIG. 3. FIG. 3 is a schematic diagram of a voltage conversion device 30 according to an embodiment of the present invention. The voltage conversion device 30 is used for converting an analog voltage Vi provided by an analog voltage source, which can be display data of a flat panel display. The voltage conversion device 30 includes a gain decision module 32, a voltage selection module 34, and a voltage output module 36. The gain decision module 32 is used for dynamically selecting a gain according to the analog voltage Vi, and includes an analog-to-digital (A/D) converter 320 and a gain selector 322. The A/D converter 320 is used for converting the analog voltage Vi into digital signals, while the gain selector 322 is used for determining a gain according to the digital signals outputted from the A/D converter 320. The voltage selection module 34 is used for outputting a direct-current (DC) voltage selected from a plurality of DC voltages Vdc(n) to the voltage output module 36 according to the analog voltage Vi and the digital signals outputted from the A/D converter 320. Preferably, the voltage output module 36 is a negative-feedback circuit formed by an operational amplifier having a first input end 360, a second input end 362, and an output end 364. The voltage output module 36 is used for outputting an amplified result of the DC voltage outputted from the voltage selection module 34 according to the gain determined by the gain selector 322. In other words, the gain decision module 32 manages to determine a gain of an output voltage Vo of the voltage output module 36 over the analog voltage Vi provided by the analog voltage source, while the voltage selection module 34 manages to determine a shift of the output voltage Vo.

In order to clearly describe the present invention, detailed structures of each module in the voltage conversion device 30 will be described in tandem with operations.

Figure 4:
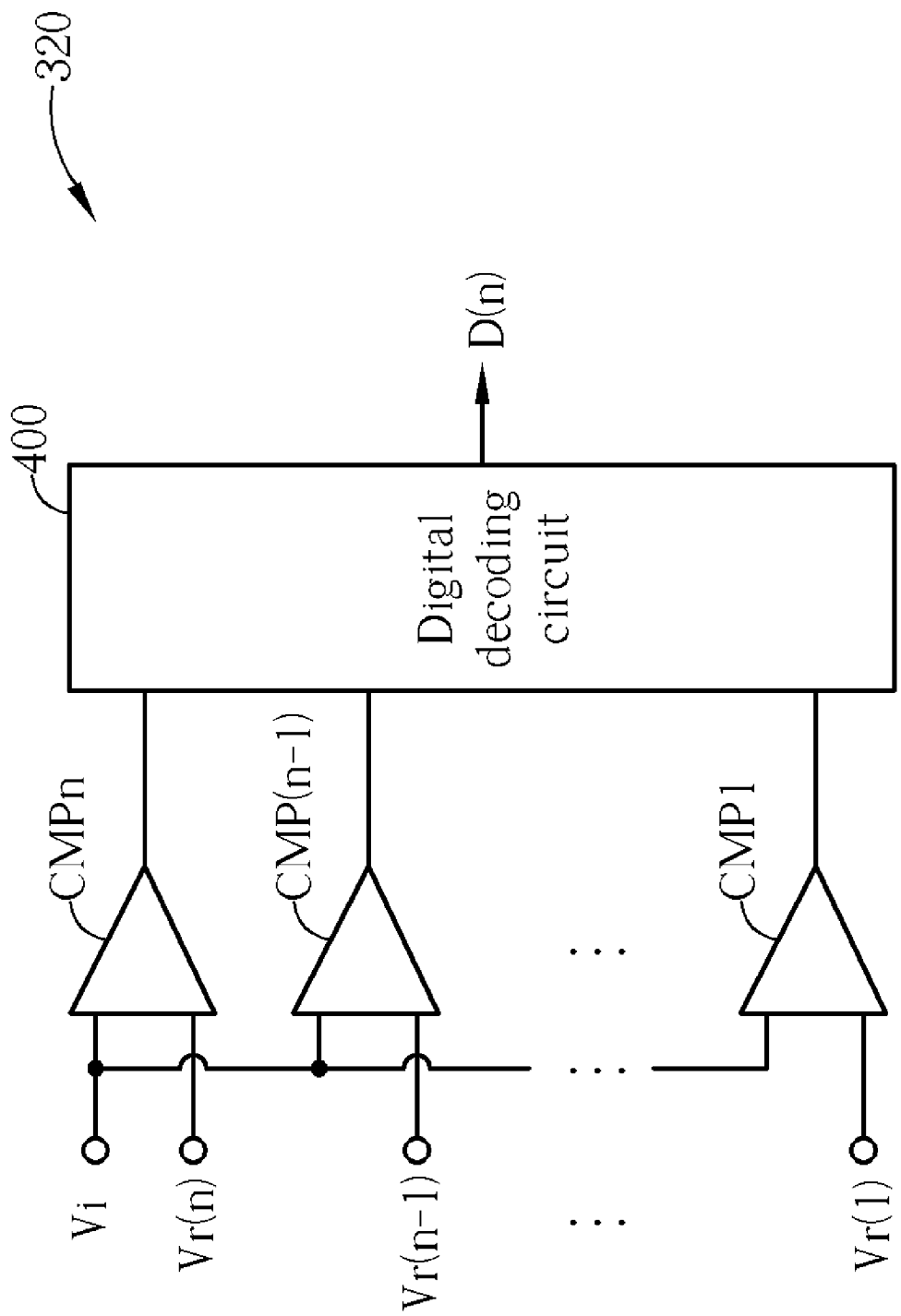
FIG. 4 is a schematic diagram of an A/D converter.

Firstly, please refer to FIG. 4, which is a schematic diagram of the A/D converter 320. The A/D converter 320 includes comparators CMP1~CMPn and a digital decoding circuit 400. The comparators CMP1~CMPn are used for comparing the analog voltage Vi with reference voltages Vr(1)~Vr(n) and for outputting comparison results to the digital decoding circuit 400. The digital decoding circuit 400 outputs a digital signal D(n) according to the comparison results.

Figure 5:
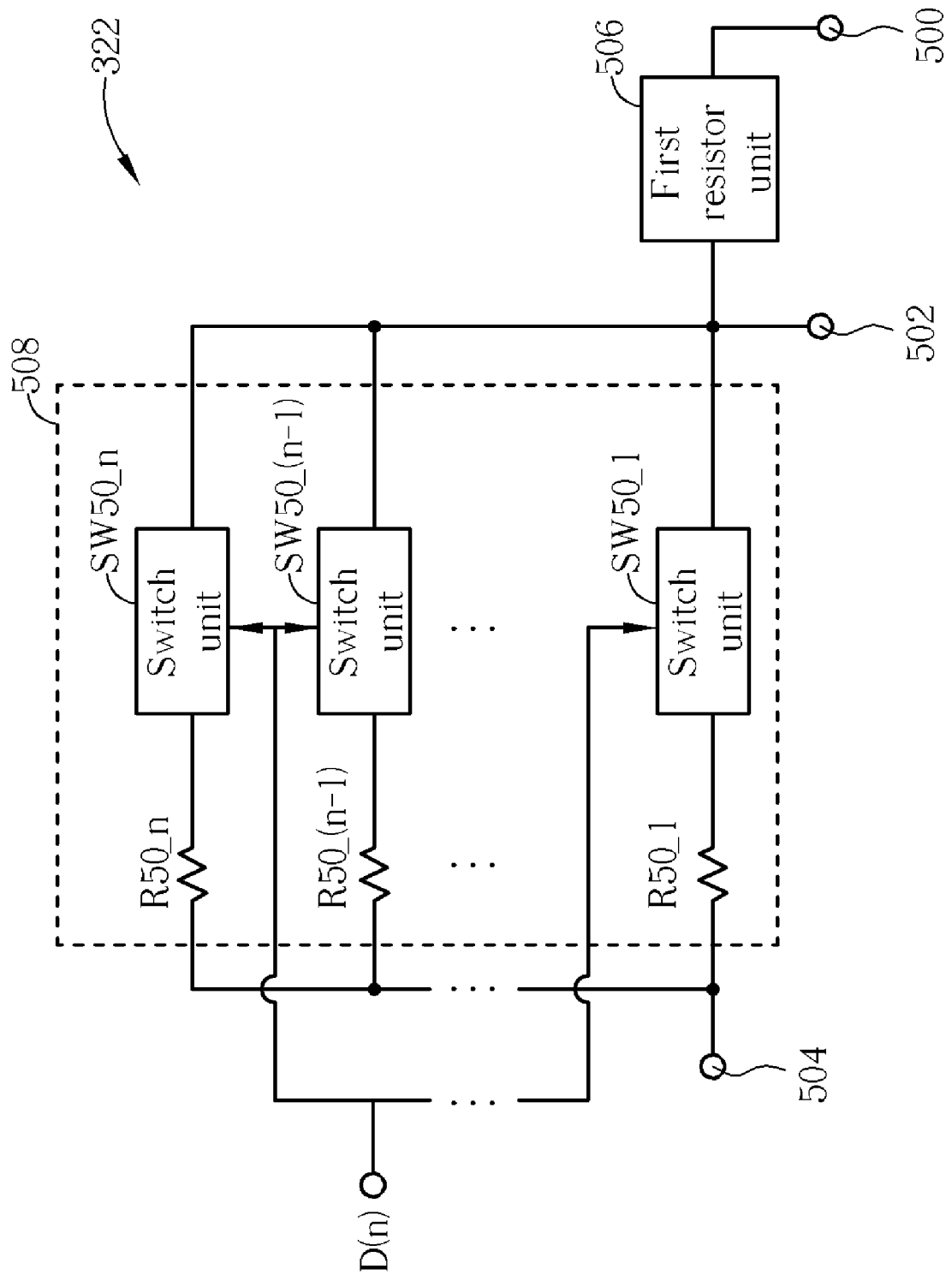
FIG. 5 is a schematic diagram of a gain selector.

Please refer to FIG. 5, which is a schematic diagram of the gain selector 322. The gain selector 322 includes a first signal end 500, a second signal end 502, a third signal end 504, a first resistor unit 506, and a resistance decision module 508. The first resistor unit 506 is coupled between the first signal end 500 and the second signal end 502 and can be a resistor having a fixed resistance or variable resistances. The resistance decision module 508 is used for determining resistance between the second signal end 502 and the third signal end 504 with resistors R50_1~R_50_n and switch units SW50_1~SW50_n according to the digital signal D(n) outputted from the A/D converter 320. All the resistors R50_1~R_50_n are coupled to the third signal end 504. Each of the switch units SW50_1~SW50_n can conduct a connection between a resistor of the resistors R50_1~R_50_n and the second signal end 502 according to the digital signal D(n). In order to provide a gain required by the voltage output module 36, the first signal end 500 is coupled to a system ground end GND, the second signal end 502 is coupled to the first input end 360 of the voltage output module 36, and the third signal end 504 is coupled to the output end 364 of the voltage output module 36. Or alternatively, the first signal end 500 is coupled to the output end 364, the second signal end 502 is coupled to the first input end 360, and the third signal end 504 is coupled to the system ground end GND.

Figure 6:
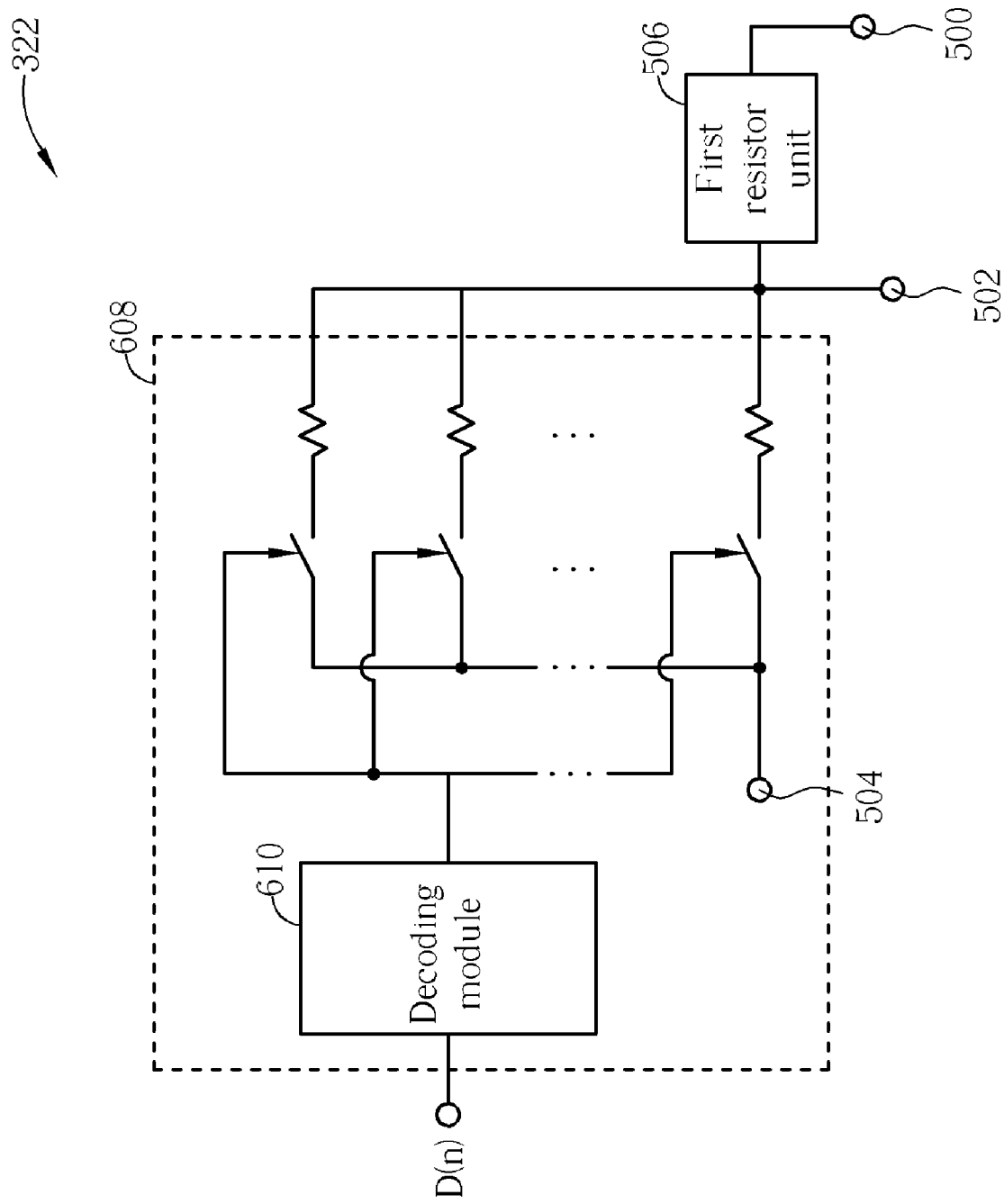
FIG. 6 is a schematic diagram of a gain selector.

In FIG. 5, an amount of switches in each of the switch units SW50_1~SW50_n is equal to a bit number of the digital signal D(n). Therefore, the more bits the digital signal D(n) contains, the more switches each of the switch units SW50_1~SW50_n includes, which cause circuit complexity in high-level applications. Thus, the present invention further provides a resistance decision module 608 substituting for the resistance decision module 508 as shown in FIG. 6. Operation principles of the resistance decision module 608 are similar to the resistance decision module 508 shown in FIG. 5. In the resistance decision module 608, a decoding module 610 decodes the digital signal D(n) outputted from the A/D converter 320 into a plurality of digital signals for corresponding switches. Under this circumstance, an amount of switches needed for the resistance decision module 608 is less than that for the resistance decision module 508, and the cost of production can be decreased.

Figure 7:
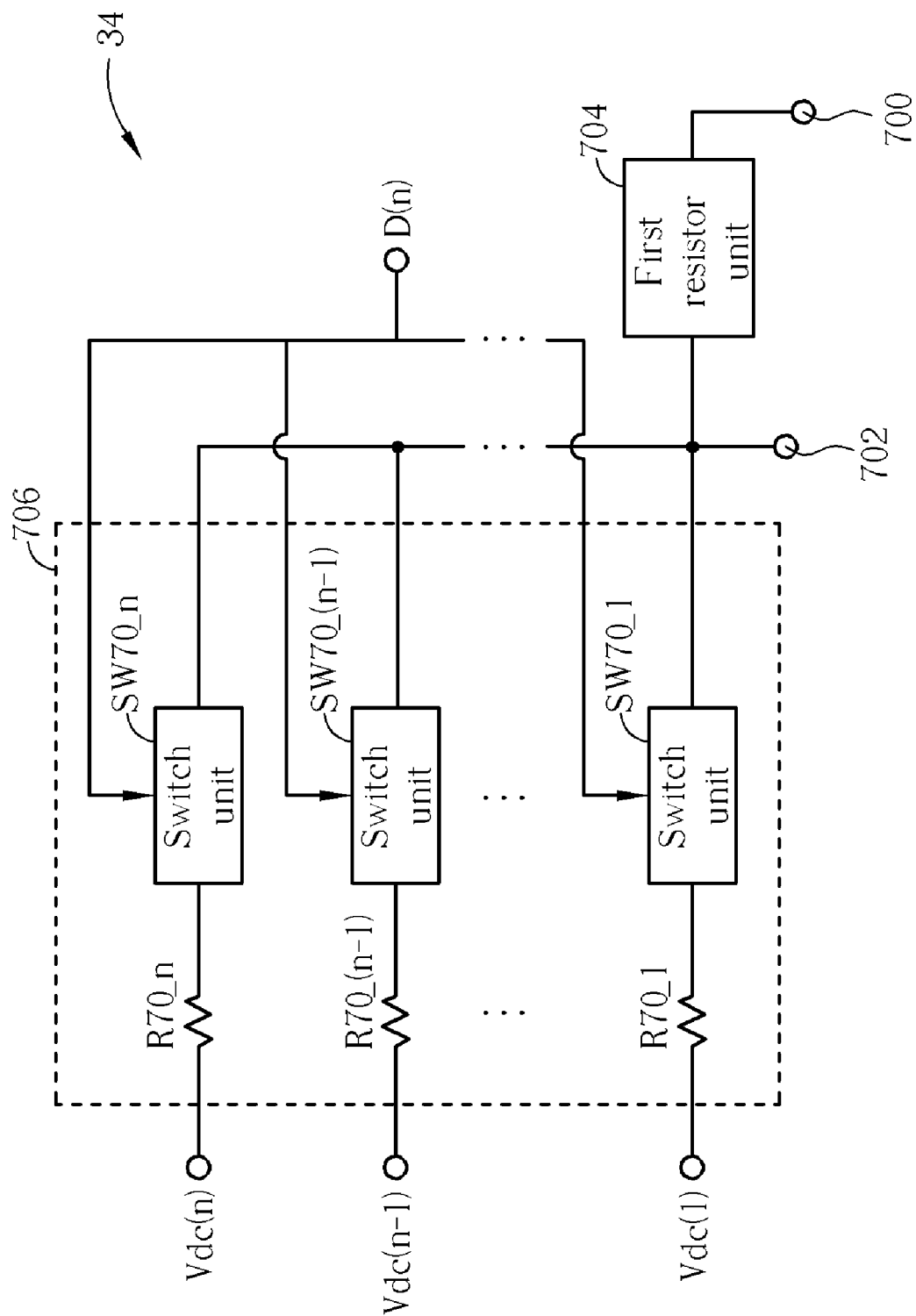
FIG. 7 is a schematic diagram of a voltage selection module.

Please refer to FIG. 7, which is a schematic diagram of the voltage selection module 34. The voltage selection module 34 includes a first signal end 700, a second signal end 702, a first resistor unit 704, and a resistance decision module 706. The first signal end 700 and the second signal end 702 respectively are coupled to the analog voltage source and the second input end 362 of the voltage output module 36. The first resistor unit 704 is coupled between the first signal end 700 and the second signal end 702, and can be implemented using a resistor of a fixed resistance or variable resistances. The resistance decision module 706 is used for selecting a DC voltage from DC voltages Vdc(1)~Vdc(n) and a resistor from resistors R70_1~R70_n according to the digital signal D(n) outputted from the A/D converter 320. Please refer to FIG. 8. A resistance decision module 806 can substitute for the resistance decision module 706, similar to the case of the resistance decision module 608 shown in FIG. 6.

Figure 9:
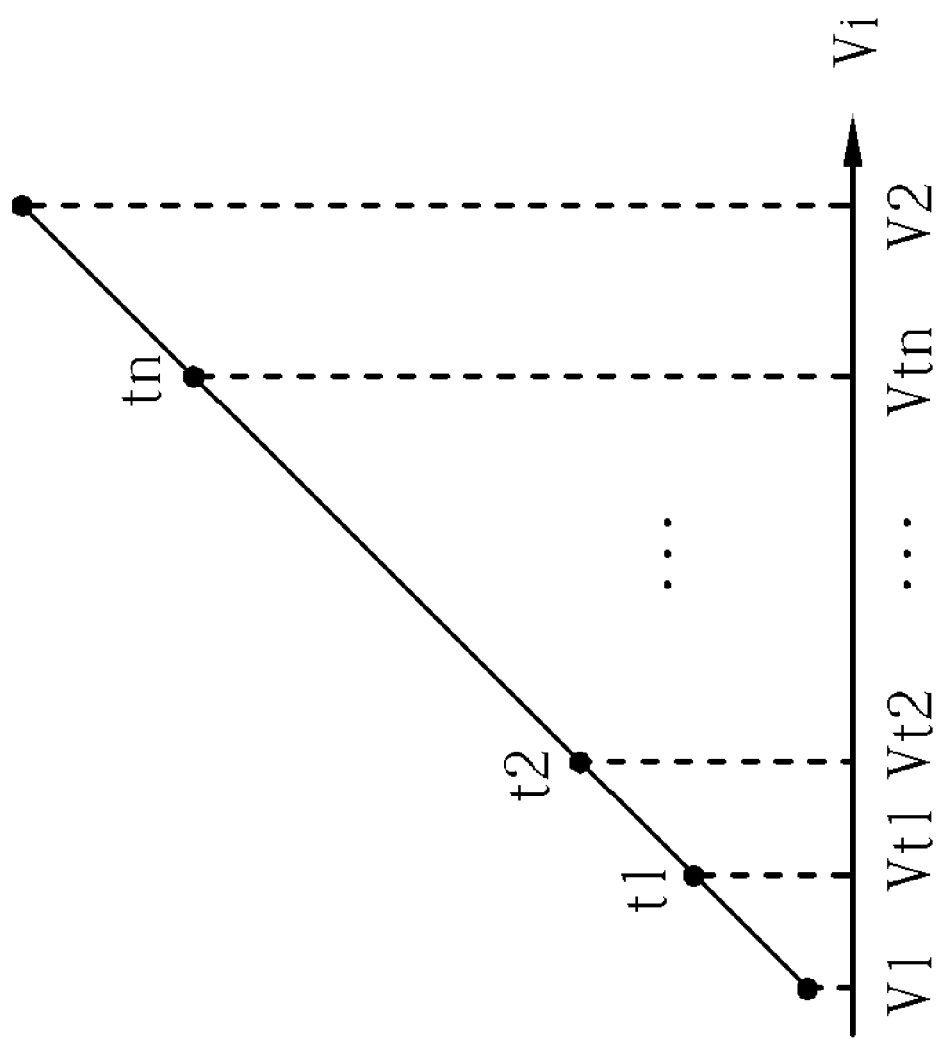
FIG. 9 is a schematic diagram of analog voltage provided by an analog voltage source.
Figure 10:
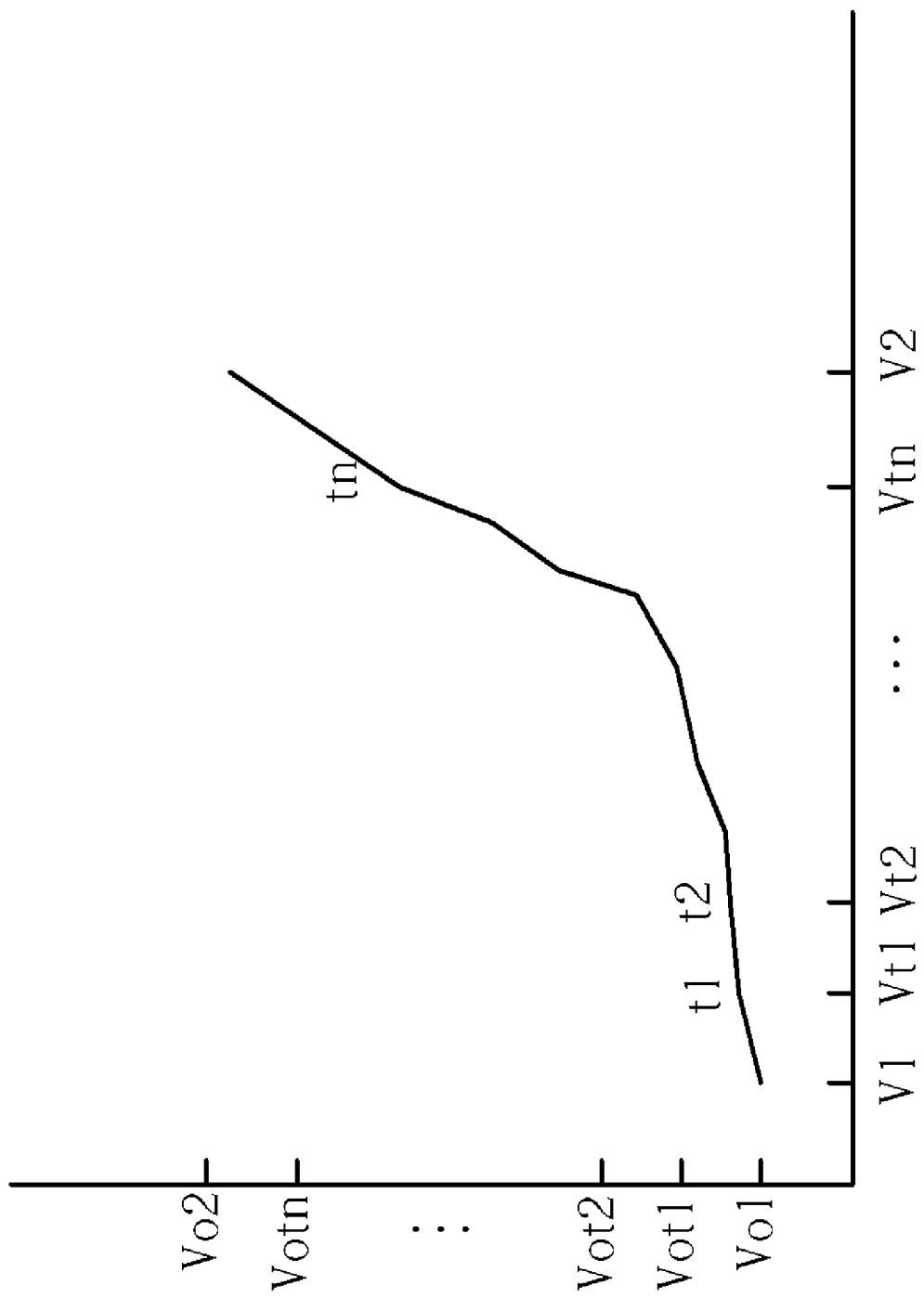
FIG. 10 is a schematic diagram of a gain curve of the output voltage Vo of the voltage conversion device according to FIG. 3 corresponding to the analog voltage according to FIG. 9.

Therefore, in the voltage conversion device 30, the voltage output module 36 amplifies the DC voltage outputted from the voltage selection module 34 with a negative feedback loop according to the gain determined by the gain selector 322. Using the present invention voltage conversion device 30, those skilled in the art can determine proper values of the reference voltages Vr(1)~Vr(n) and the DC voltages Vdc(1)~Vdc(n), and suitable resistances of the resistors R50_1~R50_n and R70_1~R70_n according to required voltage turning points (described later), so as to determine the gain by conducting or cutting off the switch units SW50_1~SW50_n and SW70_1~SW70_n according to the digital signal D(n) outputted from the A/D converter 320. For example, please refer to FIG. 9 and FIG. 10. FIG. 9 is a schematic diagram of the analog voltage Vi, while FIG. 10 is a schematic diagram of the output voltage Vo of the voltage output module 36 corresponding to the analog voltage Vi. As known from FIG. 9 and FIG. 10, a voltage range of the analog voltage Vi is between V1 and V2. If expected turning points of output voltage t1, t2, . . . , tn are corresponding to voltages Vt1, Vt2, . . . , Vtn, adjusting values of the reference voltages Vr(1)~Vr(n) and resistances of the resistors R50_1~R50_n and R70_1~R70_n can achieve a diagram of a gain curve obtained by the output voltage Vo to the input voltage Vi as shown in FIG. 10. That is to say, the voltage conversion device 30 has a non-linear gain.

In the prior art, the gain of the voltage conversion circuit is preferred to be as linear as possible. However, certain specific applications require non-linear gains, such as image display corresponding to human eyes. In the present invention, the voltage conversion device 30 can provide different gains of output voltage for the data-line-signal output circuit, so that the data-line-signal output circuit of the LCD can output the gray levels and brightness suitable for human eyes. Therefore, if an LCD performs a gray level, which is approximate to identification ability of human eyes, users can experience images more naturally.

In addition, as for the LCD, an issue of polarity inversion of output voltages also needs to be considered. In the LCD, constantly using positive or negative voltages to drive liquid crystals reduces flexibility of polarization or refraction ability of the liquid crystals, causing image quality reduced. Therefore, in order to protect the liquid crystals from being damaged by the driving voltages, alternately using positive-polarity or negative-polarity voltages to drive the liquid crystals is required. Moreover, the display panel of the LCD includes parasitic capacitors, which reduces image quality due to a residual image effect produced by storage charge when one image is displayed on the LCD panel too long. The way of alternately using the positive or negative voltage to drive the liquid crystals can also improve the effect of the parasitic capacitors, and can be methods of line inversion, and dot inversion. In another word, polarities of the data line signals outputted by the data-line-signal output circuit are inverted appropriately, so as to avoid residual images or to prevent the liquid crystals from damage. Therefore, the present invention further provides a voltage conversion device for displaying data for an LCD.

Figure 11:
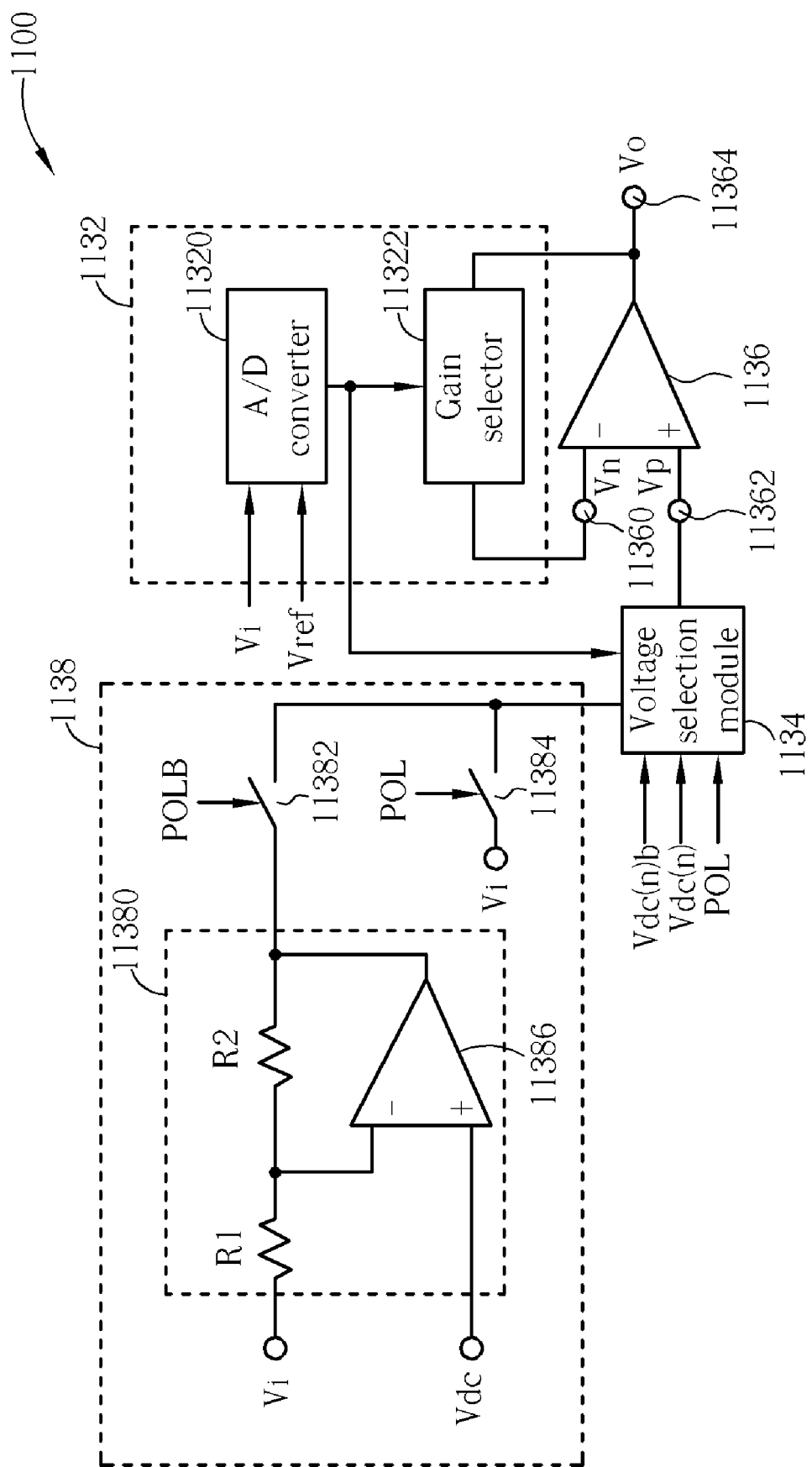
FIG. 11 is a schematic diagram of a voltage conversion device according to an embodiment of the present invention.

Please refer to FIG. 11, which is a schematic diagram of a voltage conversion device 1100 according to an embodiment of the present invention. The voltage conversion device 1100 is used for converting an analog voltage Vi provided by an analog voltage source, which can be display data of an LCD. The voltage conversion device 1100 includes a gain decision module 1132, a voltage selection module 1134, a voltage reception module 1136, and a voltage output module 1138. The gain decision module 1132 is used for dynamically selecting a gain according to the analog voltage Vi and includes an analog to digital (A/D) converter 11320 and a gain selector 11322. The A/D converter 11320 is used for converting the analog voltage Vi into digital signals while the gain selector 11322 is used for determining a gain according to the digital signals outputted from the A/D converter 11320. The voltage selection module 1134 is used for outputting a direct-current (DC) voltage selected from a plurality of DC voltages Vdc(n) to the voltage output module 1136 according to a polarity-selection signal POL, the analog voltage Vi or an inversion of the analog voltage Vi, and the digital signals outputted from the A/D converter 11320. Preferably, the voltage output module 1136 is a negative-feedback circuit composed of operational amplifiers, and includes a first input end 11360, a second input end 11362, and an output end 11364. The voltage output module 1136 is used for outputting an amplified result of the DC voltage outputted from the voltage selection module 1134 according to the gain determined by the gain selector 11322. In other words, the gain decision module 1132 manages to determine a gain of an output voltage Vo of the voltage output module 1136 to the analog voltage Vi while the voltage selection module 1134 manages to determine a shift of the output voltage Vo.

In FIG. 11, the voltage reception module 1138 is used for receiving the analog voltage Vi and a DC voltage Vdc and for outputting the analog voltage Vi for the voltage selection module 1134 after transforming an polarity of the analog voltage Vi according to the polarity-selection signal POL and an inverse polarity-selection signal POLB. The voltage reception module 1138 includes a polarity-inversion module 11380 and switch units 11382, 11384. The polarity-inversion module 11380 includes resistors R1, R2 and an operational amplifier 11386, and is used for inverting the polarity of the analog voltage Vi provided by the analog voltage source. The switch unit 11382 is coupled between the polarity-inversion module 11380 and the voltage selection module 1134, and is used for conducting a connection between the polarity-inversion module 11380 and the voltage selection module 1134 according to the inverse polarity-selection signal POLB. In addition, the switch unit 11384 is coupled between the voltage selection module 1134 and the analog voltage source, and is used for conducting a connection between the voltage selection module 1134 and the analog voltage source according to the polarity-selection signal POL. In other words, when the polarity-selection signal POL is at a high level while the inverse polarity-selection signal POLB is at a low level, the voltage selection module 1134 performs relevant operations according to the analog voltage Vi. On the contrary, when the polarity-selection signal POL is at the low level while the inverse polarity-selection signal POLB is at the high level, the voltage selection module 1134 performs relevant operations according to the inverse voltage of the analog voltage Vi.

Figure 8:
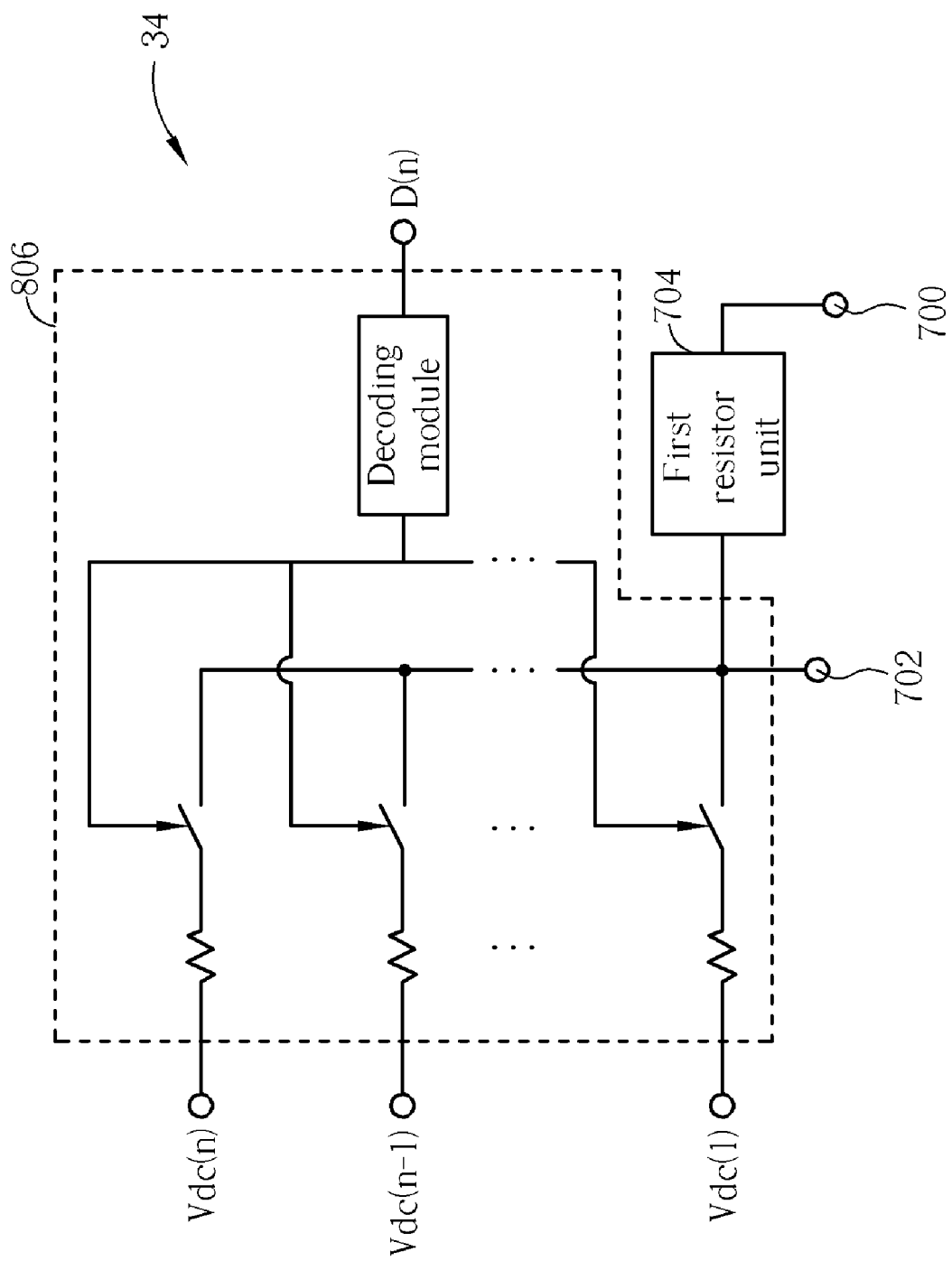
FIG. 8 is a schematic diagram of a voltage selection module.
Figure 23:
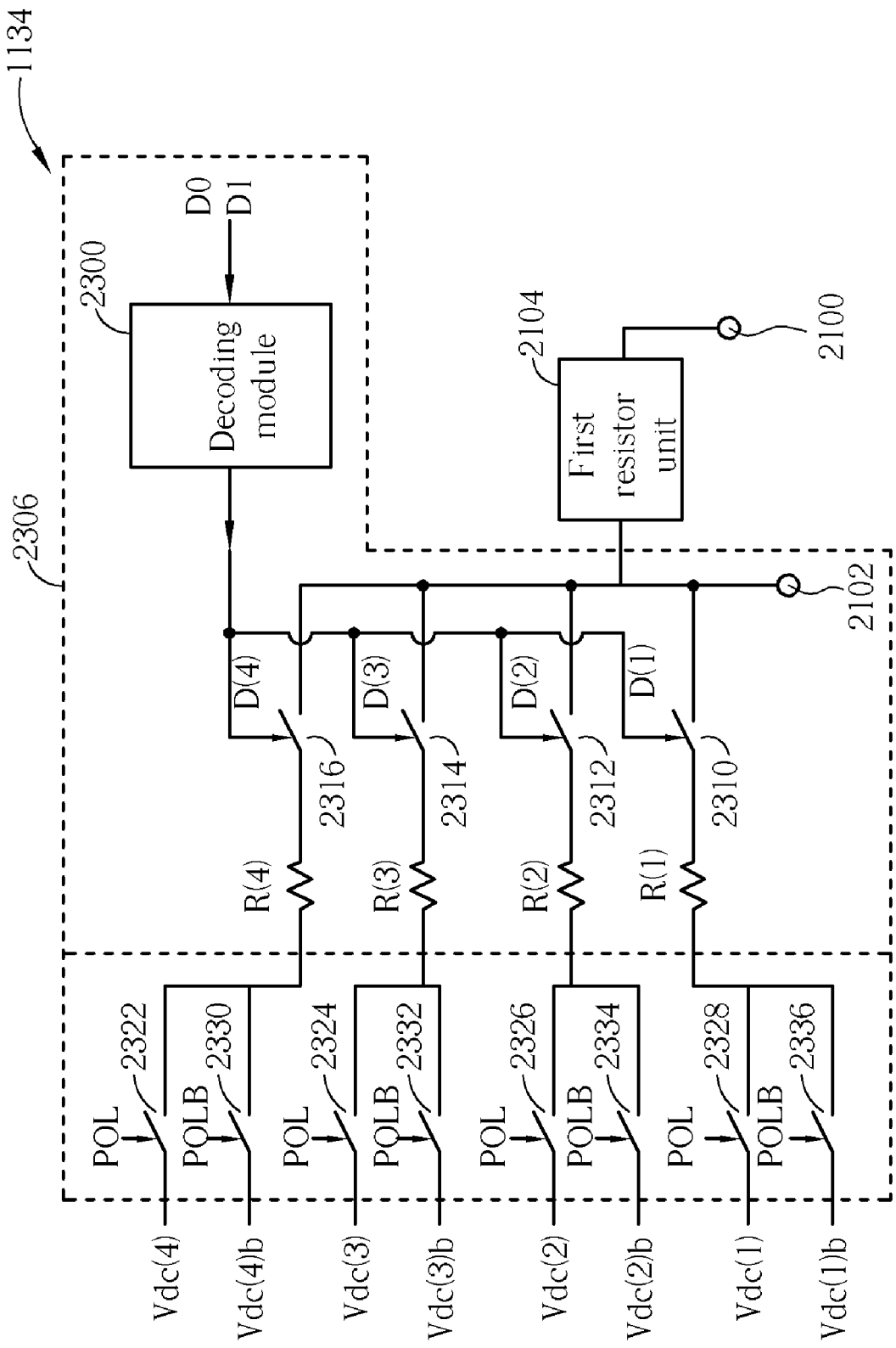
FIG. 23 is a schematic diagram of a voltage selection module.

In the voltage conversion device 1100, the operating principle of the gain decision module 1132 and the voltage output module 1136 is exactly the same as that of the gain decision module 32 and the voltage output module 36 of FIG. 3. Those skills in the art can refer to FIG. 4 to 6 for implementing the gain decision module 1132 and the voltage output module 1136, which will not be narrated in detail. Besides, the gain decision module 1134 can be implemented by adding a plurality of switch units into the voltage selection module 34 as shown in FIG. 7 and FIG. 8. The plurality of switch units are respectively coupled to the resistance decision module and a plurality of DC voltage sources, and conduct the connection between the plurality of DC voltage sources and the resistance decision module according to the polarity-selection signal POL and the inverse polarity-selection signal POLB (which will be described in detail by FIG. 21 and FIG. 23).

Similar to the voltage conversion device 30, the voltage conversion device 1100 can achieve a diagram of the gain curve as shown in FIG. 10 by controlling the reference voltages inputted to the A/D converter 11320 and each resistance in the gain selector 11322 and the voltage selection module 1134. In short, the voltage conversion device 1100 has a non-linear gain. In addition, by the polarity-selection signal POL, the voltage conversion device 1100 can alternate polarities with the non-linear gain.

Figure 12:
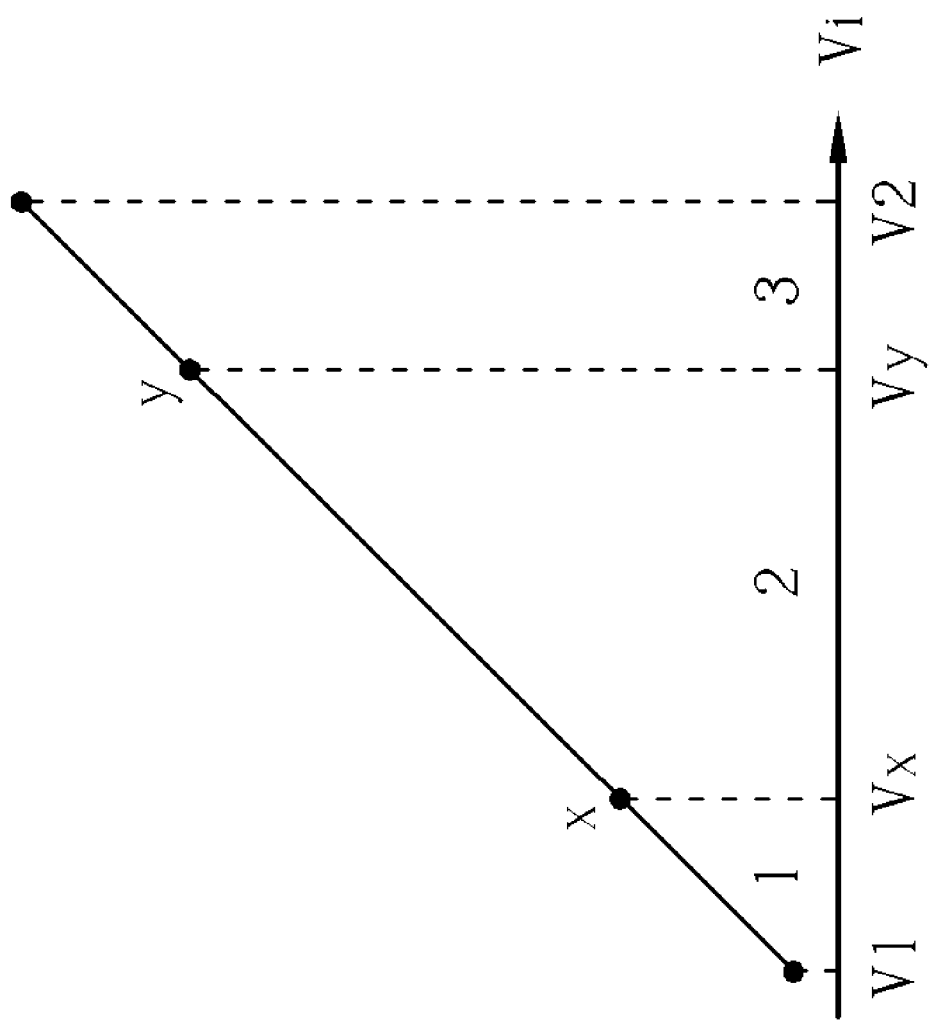
FIG. 12 is a schematic diagram of the analog voltage provided by the analog voltage source.
Figure 13:
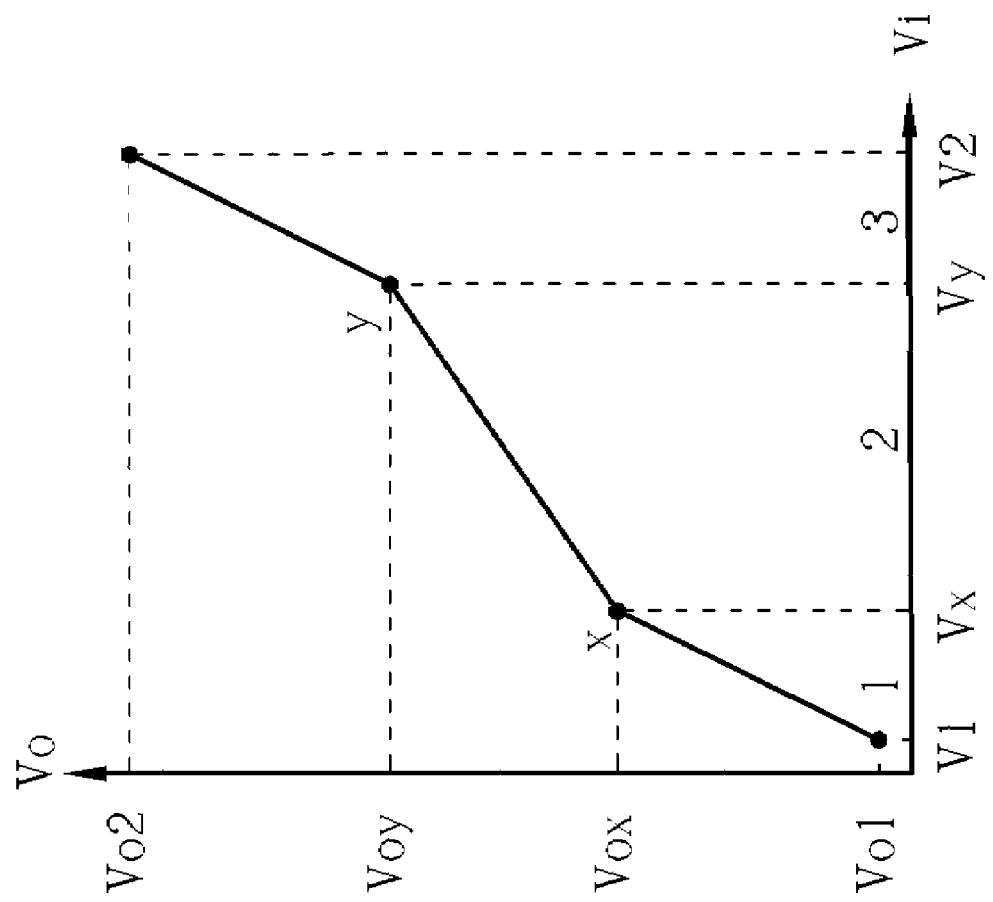
FIG. 13 is a schematic diagram of a gain curve of an expected output voltage of the voltage conversion device corresponding to the analog voltage according to FIG. 12.
Figure 14:
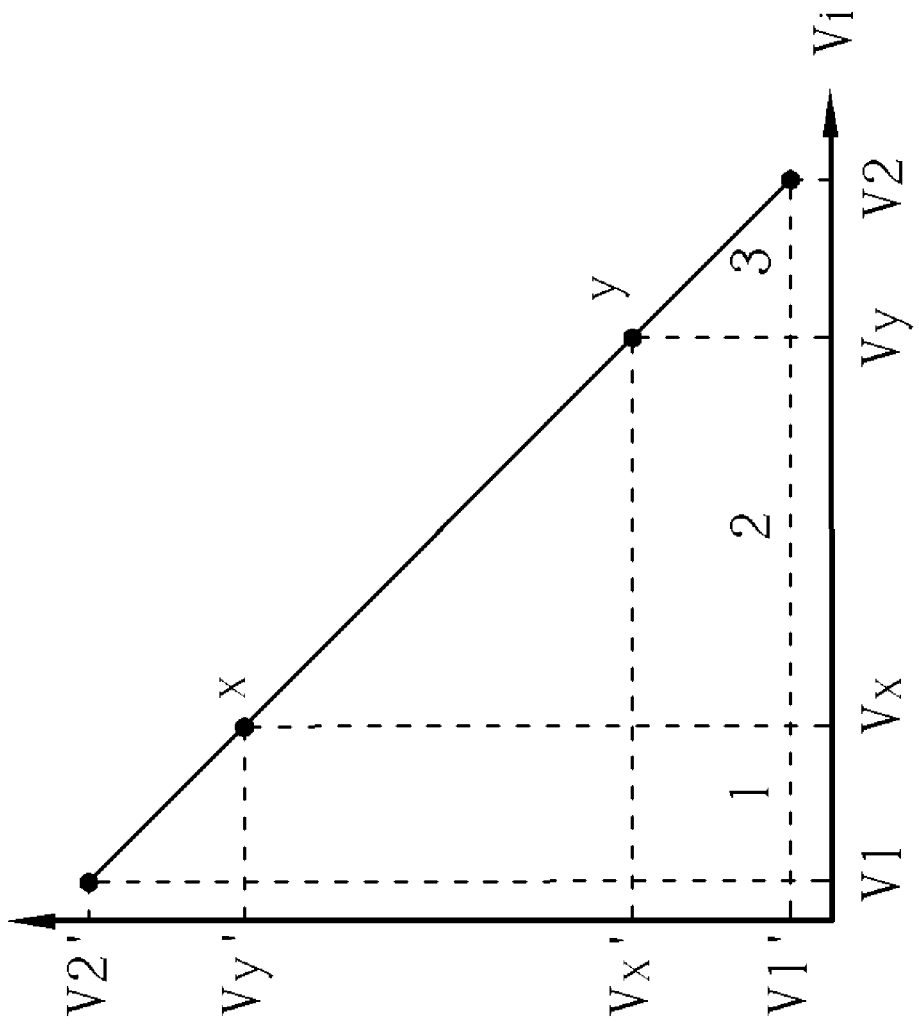
FIG. 14 is a schematic diagram of a waveform of the analog voltage with an inverse polarity according to FIG. 12.
Figure 15:
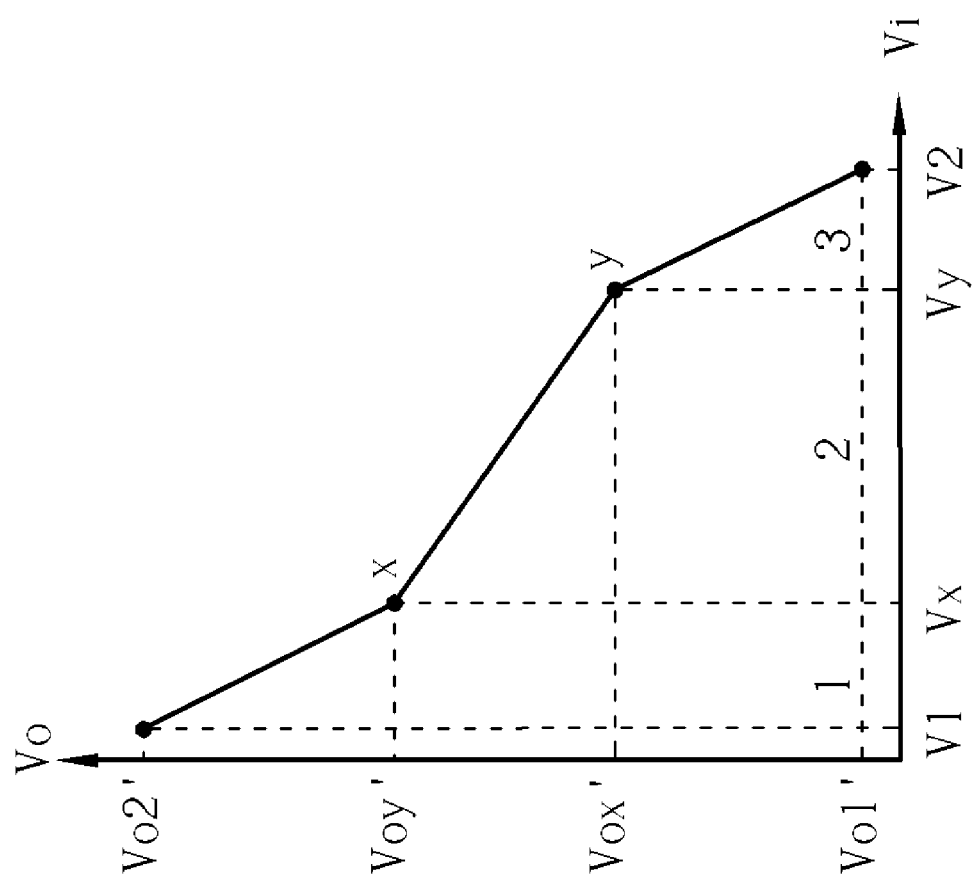
FIG. 15 is a schematic diagram of a gain curve of an expected output voltage of the voltage conversion device corresponding to the analog voltage according to FIG. 14.

Therefore, adjusting number and values of the elements in the voltage conversion device 1100 can obtain an expected gain curve. For example, please refer to FIG. 12 and FIG. 13. FIG. 12 is a schematic diagram of the analog voltage Vi provided by the analog voltage source, while FIG. 13 is a schematic diagram of an expected output voltage Vo corresponding to the analog voltage Vi. As known in FIG. 12 and FIG. 13, the voltage range of the analog voltage Vi is between the V1 and V2. If a turning point x and y of the expected output voltage are corresponding to voltages Vx and Vy, a diagram of a gain curve as shown in FIG. 13 can be produced via controlling the reference voltage Vref, which is inputted to the A/D converter 11320, resistance of each resistor, and the dc voltages Vdc, Vdc(1), . . . , Vdc(n) in the gain selector 11322 and the voltage selection module 1134. At the same time, when the inverse polarity-selection signal POLB is enabled, voltages inputted to the voltage selection module 1134 form as the voltage curve shown in FIG. 14. Meanwhile, a gain curve of the output voltage Vo of the voltage conversion device 1100 to the input voltage Vi is shown in FIG. 15. In short, the gain of the voltage conversion device 1100 is negative and non-linear.

Figure 16:
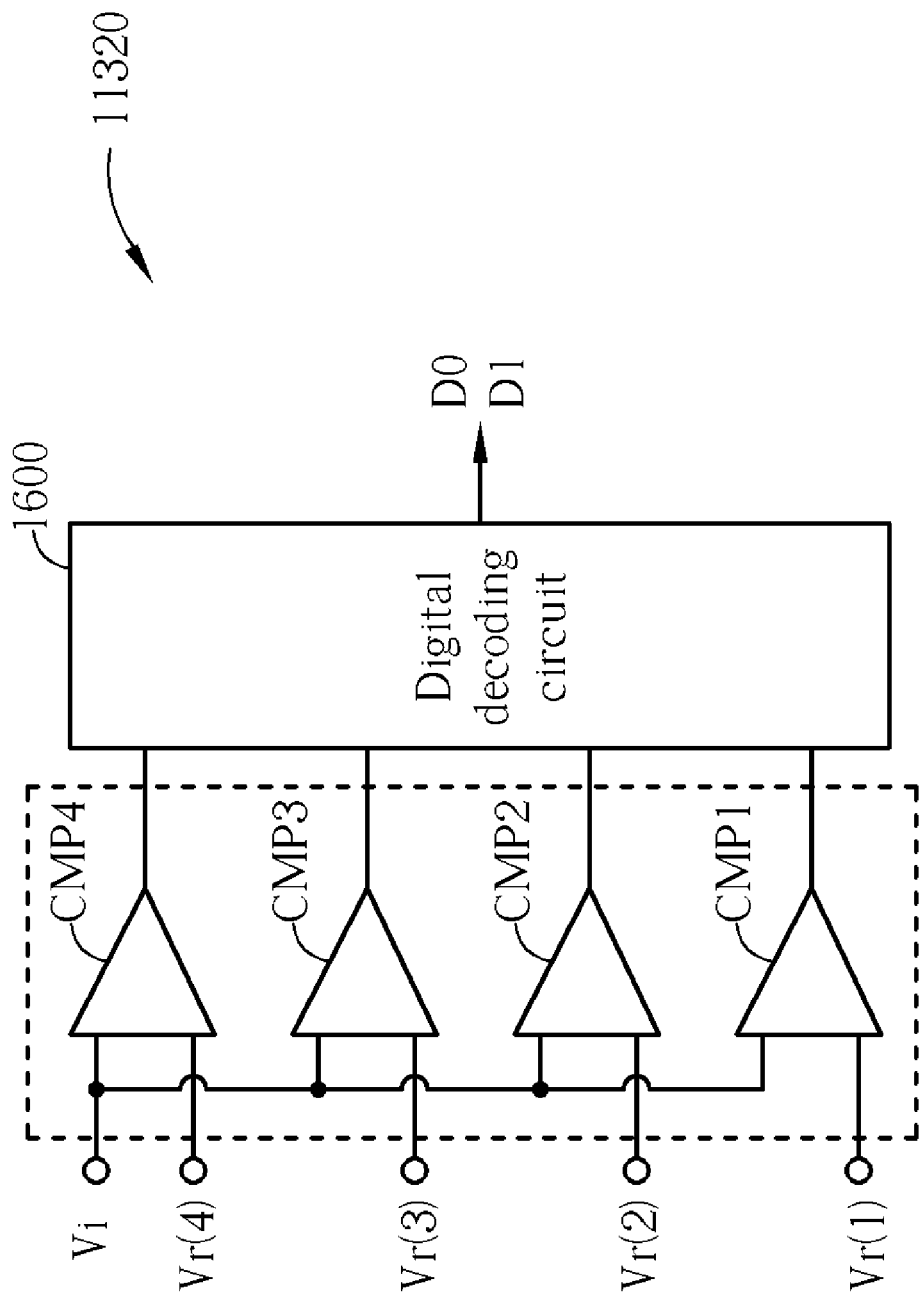
FIG. 16 is a schematic diagram of an A/D converter.

Adjusting number and values of the elements in the voltage conversion device 1100 can obtain the gain curves shown in FIG. 13 and FIG. 15. In advance, please refer to FIG. 16, which is a schematic diagram of the A/D converter 11320. In order to achieve the gain curves shown in FIG. 13 and FIG. 15, the A/D converter 11320 includes comparators CMP1~CMP4 and a digital decoding circuit 1600. The digital decoding circuit 1600 outputs digital signals D0 and D1 according to the comparison result outputted from the comparators CMP1~CMP4.

Figure 17:
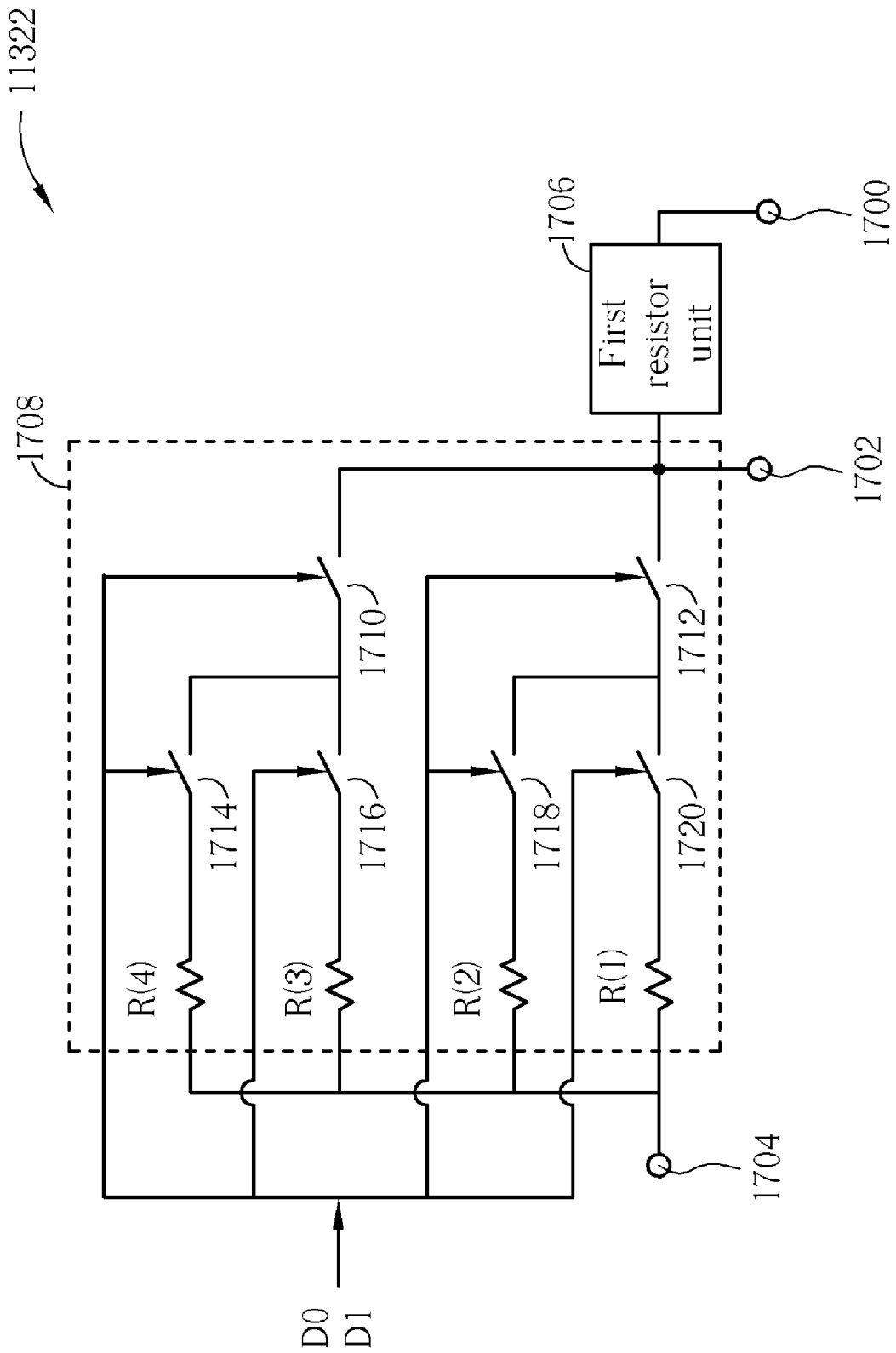
FIG. 17 is a schematic diagram of a gain selector.

Please refer to FIG. 17, which is a schematic diagram of the gain selector 11322. The gain selector 11322 includes a first signal end 1700, a second signal end 1702, a third signal end 1704, a first resistor unit 1706, and a resistance decision module 1708. The operating principle of the gain selector

Figure 19:
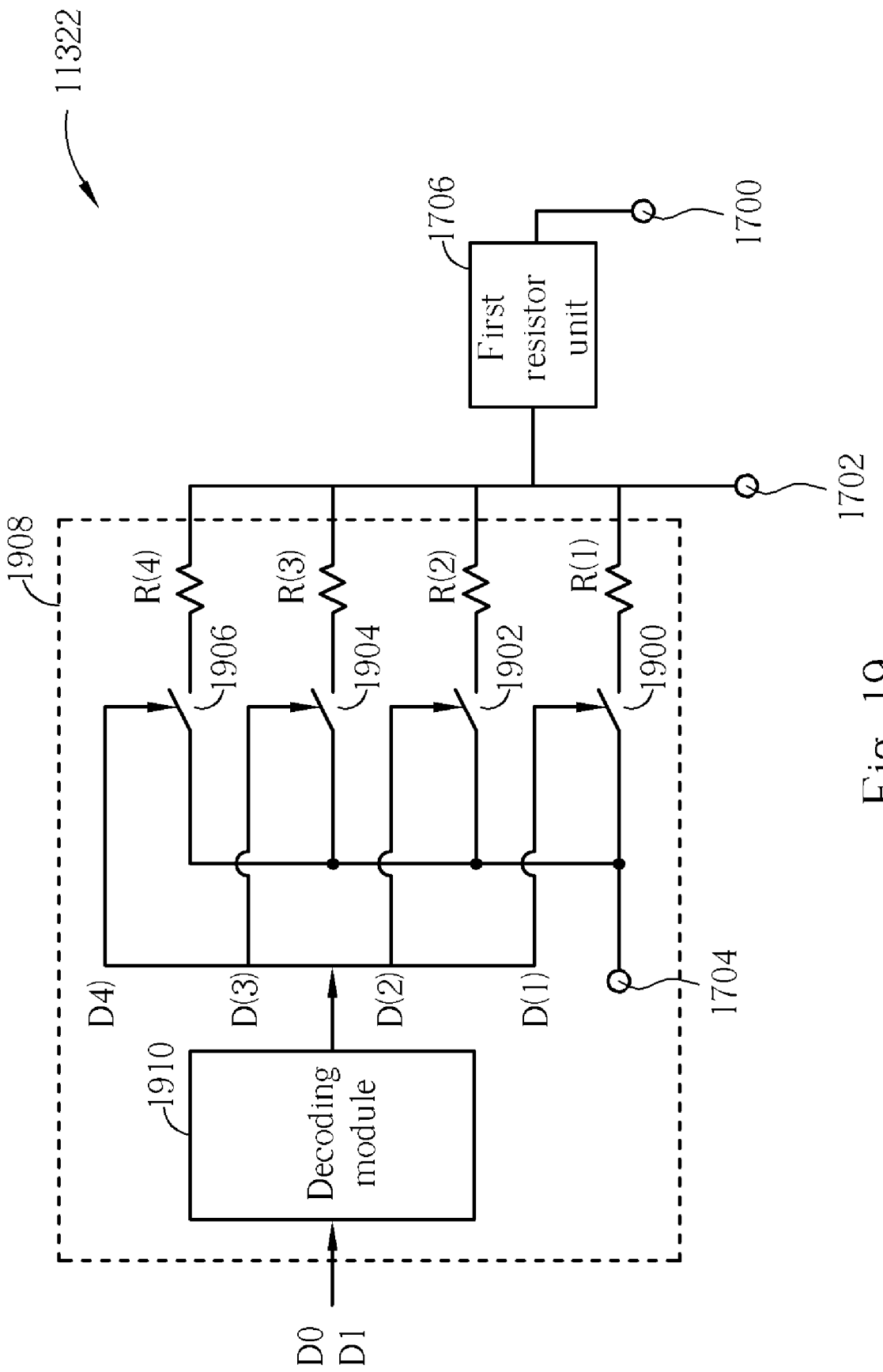
FIG. 19 is a schematic diagram of a gain selector.

11322 is similar to that of the gain selector 322 in FIG. 5, which will not be narrated in details. In order to achieve the gain curves shown in FIG. 13 and FIG. 15, the resistance decision module 1708 includes resistors R(1)~R(4) and switches 1710, 1712, 1714, 1716, 1718, and 1720. The switch 1710 is under control of the digital signal D1. The switch 1712 is under control of an inverse signal of the digital signal D1. The switches 1714 and 1718 are under control of the digital signal D0. The switches 1716 and 1720 are under control of an inverse signal of the digital signal D0. In other words, the operating principle of the resistance decision module 1708 performs as a truth table shown in FIG. 18. Note that the gain selector 11322 in FIG. 17 is implemented based on the gain selector 322 in FIG. 5. In addition, a resistance decision module 1908 implemented based on the resistance decision module 608 in FIG. 6 can replace the resistance decision module 1708, shown in FIG. 19. The resistance decision module 1908 includes resistors R(1)~R(4), switches 1900, 1902, 1904, 1906, and a decoding module 1910. The decoding module 1910 decodes the digital signals D0 and D1 into digital signals D(1), D(2), D(3) and D(4), which respectively control the switches 1900, 1902, 1904 and 1906. Under this circumstance, the operating principle of the resistance decision module 1908 performs as a truth table shown in FIG. 20.

Figure 21:
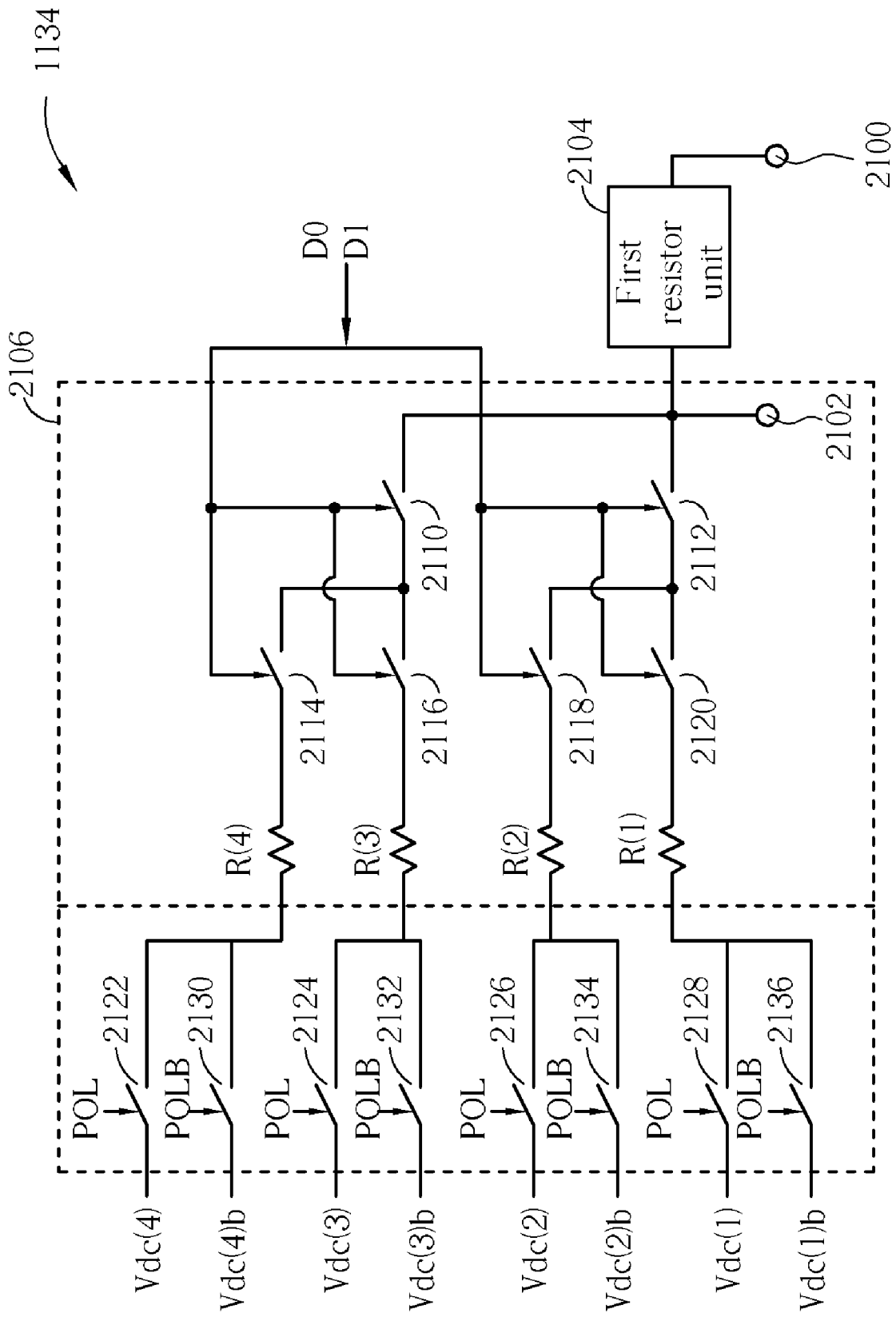
FIG. 21 is a schematic diagram of a voltage selection module.

Please refer to FIG. 21, which is a schematic diagram of the voltage selection module 1134. The voltage selection module 1134 includes a first signal end 2100, a second signal end 2102, a first resistor unit 2104, and a resistance decision module 2106. The operating principle of the voltage selection module 1134 is similar to that of the voltage selection module 34 in FIG. 7. The resistance decision module 2106 includes resistors R(1)~R(4) and switches 2110, 2112, 2114, 2116, 2118, 2120, 2122, 2124, 2126, 2128, 2130, 2132, 2134, and 2136. The switch 2110 is under control of the digital signal D1. The switch 2112 is under control of an inverse signal of the digital signal D1. The switches 2114 and 2118 are under control of the digital signal D0. The switches 2116 and 2120 are under control of an inverse signal of the digital signal D0. The switches 2122, 2124, 2126 and 2128 are under control of the polarity-selection signal POL. The switches 2130, 2132, 2134, and 2136 are under control of the inverse polarity-selection signal POLB. In other words, the operating principle of the resistance decision module 2106 performs as a truth table shown in FIG. 22. Note that the voltage selection module 1134 in FIG. 21 is implemented based on the voltage selection module 34 in FIG. 7. In addition, a resistance decision module 2306 implemented based on the resistance decision module 806 in FIG. 8 can replace the resistance decision module 2106, shown in FIG. 23. The resistance decision module 2306 includes resistors R(1)~R(4), switches 2310, 2312, 2314, 2316, 2322, 2324, 2326, 2328, 2330, 2332, 2334, 2336, and a decoding module 2300. The decoding module 2300 decodes the digital signals D0 and D1 into digital signals D(1), D(2), D(3) and D(4), which respectively control the switches 2310, 2312, 2314, and 2316. The switches 2322, 2324, 2326 and 2328 are under control of the polarity-selection signal POL while the switches 2330, 2332, 2334, 2336 are under control of the inverse polarity-selection signal POLB. Under this circumstance, the operating principle of the resistance decision module 2306 performs as a truth table shown in FIG. 24.

Therefore, since the voltage conversion device 1100 transforms display data of the LCD, the LCD can output gray levels suitable for identification ability of human eyes, so as to smooth gradient effect of images. Besides, the voltage conversion device 1100 can transform polarity of output signals by controlling the polarity-selection signal POL and the inverse polarity-selection signal POLB. This prevents the LCD from keeping using positive-polarity or negative-polarity voltages to drive liquid crystals, so as to prevent residual image effect or damage of liquid crystals.

As for the present invention voltage conversion device, those skills in the art can make modifications according to an expected gain curve. For example, in FIGS. 12 and 13, if characteristics of the expected gain curve are as follows: V1=0.1V, Vx=0.2V, Vy=0.9V, V2=1V, Vo1=0.1V, Vox=1V, Voy=4V, Vo2=4.9V. Then, in FIG. 16, setVr(1)=0.1V, Vr(2)=0.2V, Vr(3)=0.9V, and Vr(4)=1V. In FIG. 17 and FIG. 11, connect the first signal end 1700 to the output end 11364 of the voltage output module 1136, the second signal end 1702 to the first input end 11360 of the voltage output module 1136, and the third signal end 1704 to the ground. Set R(1)=[(resistance of the first resistor unit 1706)/17](Ω), R(2)={[(resistance of the first resistor unit 1706)*7]/53} (Ω)), and R(3)=[(resistance of the first resistor unit 1706)/17](Ω)

Besides, as for FIG. 21, in condition of R(1)=R(2)=R(3)=resistance of the first resistor unit 2104, set Vdc(1)=(−0.8/9)(V), Vdc(2)=(0.1/3)(V), and Vdc(3)=(−4.1/9)(V). Similarly, in FIG. 14 and FIG. 15, if characteristics of the expected gain curve are as follows: V1=0.1V, Vx=0.2V, Vy=0.9V, V2=1V, V1'=0.1V, Vx'=0.2V, Vy'=0.9V, V2'=1V, Vo1'=0.1V, Vox'=1V, Voy'=4V, and Vo2'=4.9V. Then, in FIG. 16, set Vr(1)=0.1V, Vr(2)=0.2V, Vr(3)=0.9V, and Vr(4)=1V. In FIG. 17 and FIG. 11, connect the first signal end 1700 to the output end 11364 of the voltage output module 1136, the second signal end 1702 to the first input end 11360, and the third signal end 1704 to the ground. Set R(1)=[(resistance of the first resistor unit 1706)/17](Ω), R(2)={[(resistance of the first resistor unit 1706)*7]/53} (Ω), and R(3)=[(resistance of the first resistor unit 1706)/17](Ω)

As for FIG. 21, in condition of R(1)=R(2)=R(3)=resistance of the first resistor unit 2104, set Vdc(1)b=(−4.1/9)(V), Vdc(2)b=(0.1/3)(V), and Vdc(3)b=(−0.8/9)(V). Besides, in FIG. 11, set R1/R2=1, and Vdc=1.1V. Difference between FIG. 14 and 15 and FIG. 12 and 13 is that the input voltages V1, Vx, Vy, V2 in FIG. 12 are passed through the polarity inversion module 11380 in FIG. 11 in advanced and transformed to corresponding voltages V2', Vy', Vx', V1' in FIG. 14, and then the gain decision module 1132 of the voltage conversion device 1100 determines which gain of the voltage output module 1136 to output while the voltage selection module 1134 determines how much shift of the output voltage Vo is.

Figure 25:
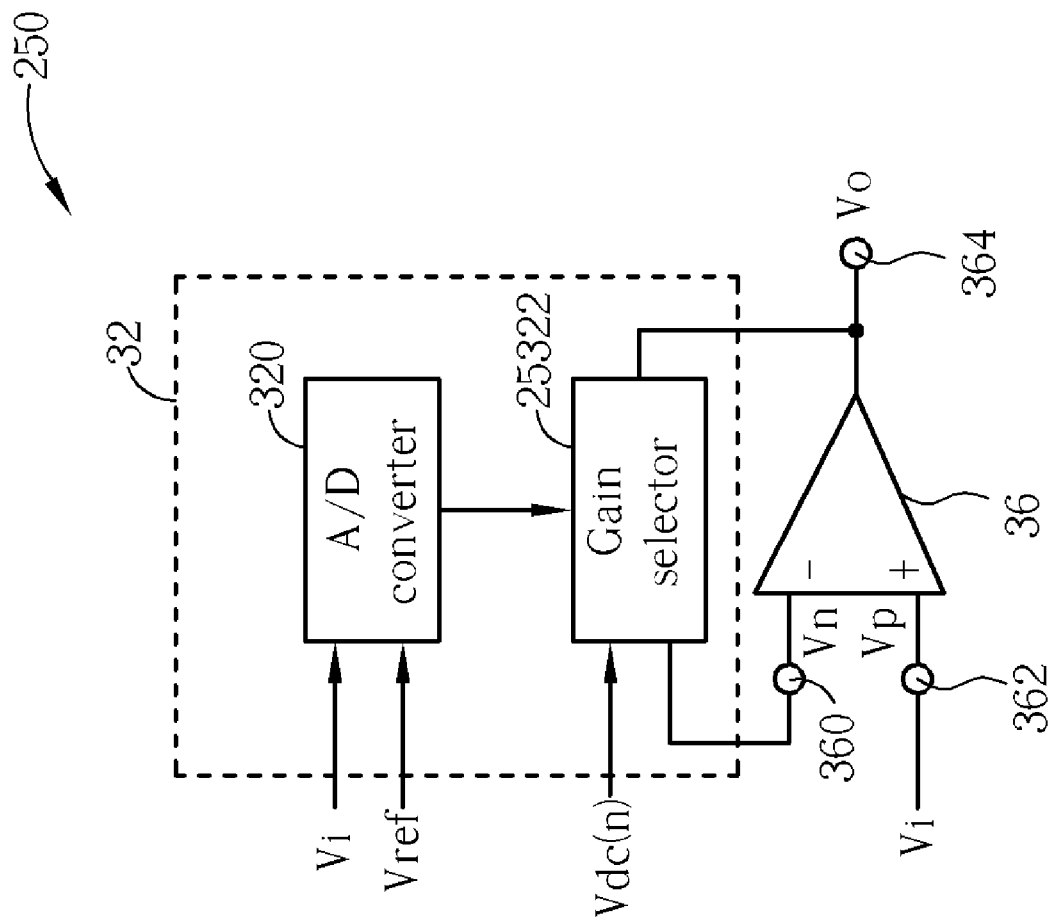
FIG. 25 is a schematic diagram of a voltage conversion device according to an embodiment of the present invention.
Figure 26:
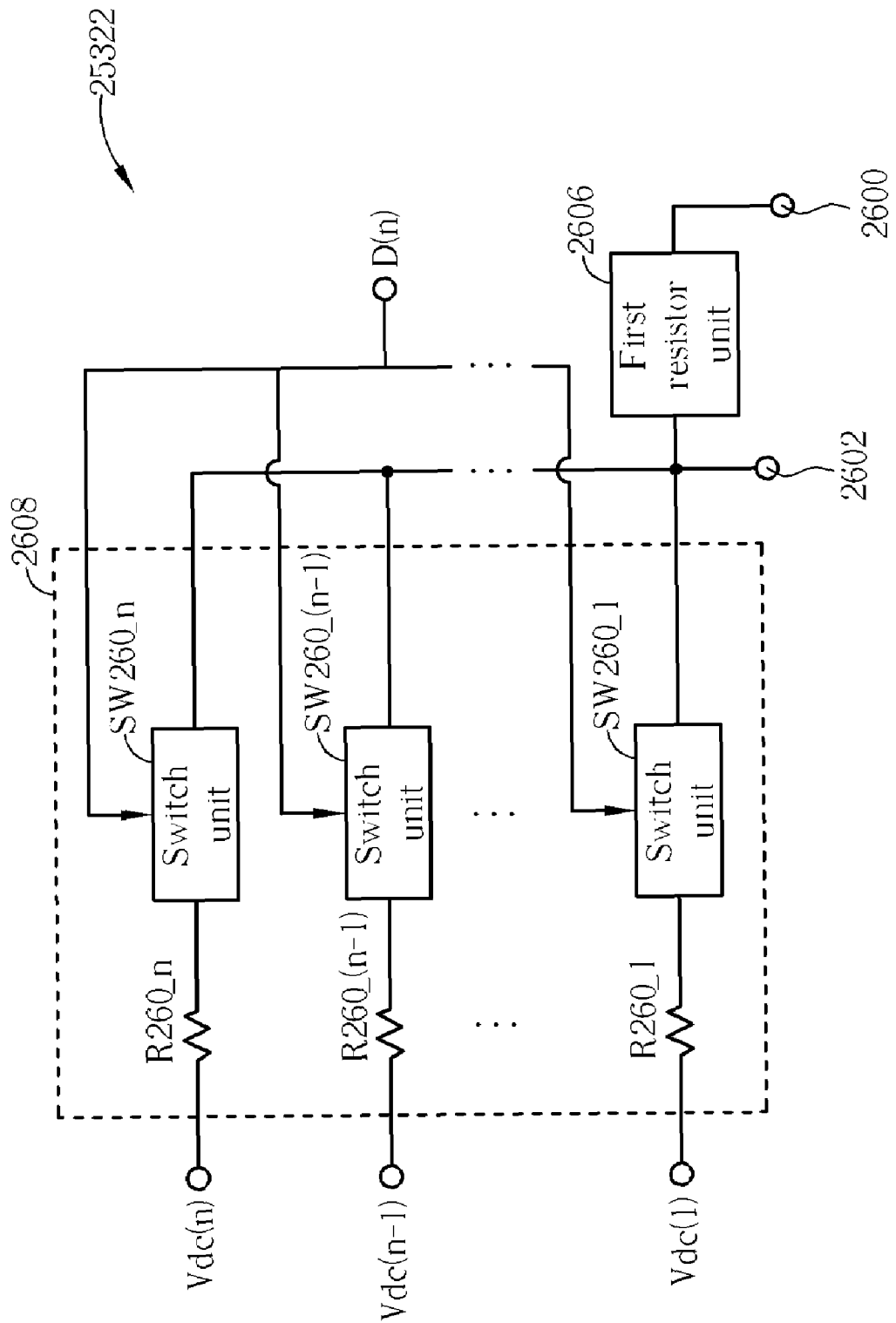
FIG. 26 is a schematic diagram of a gain selector according to FIG. 25.
Figure 27:
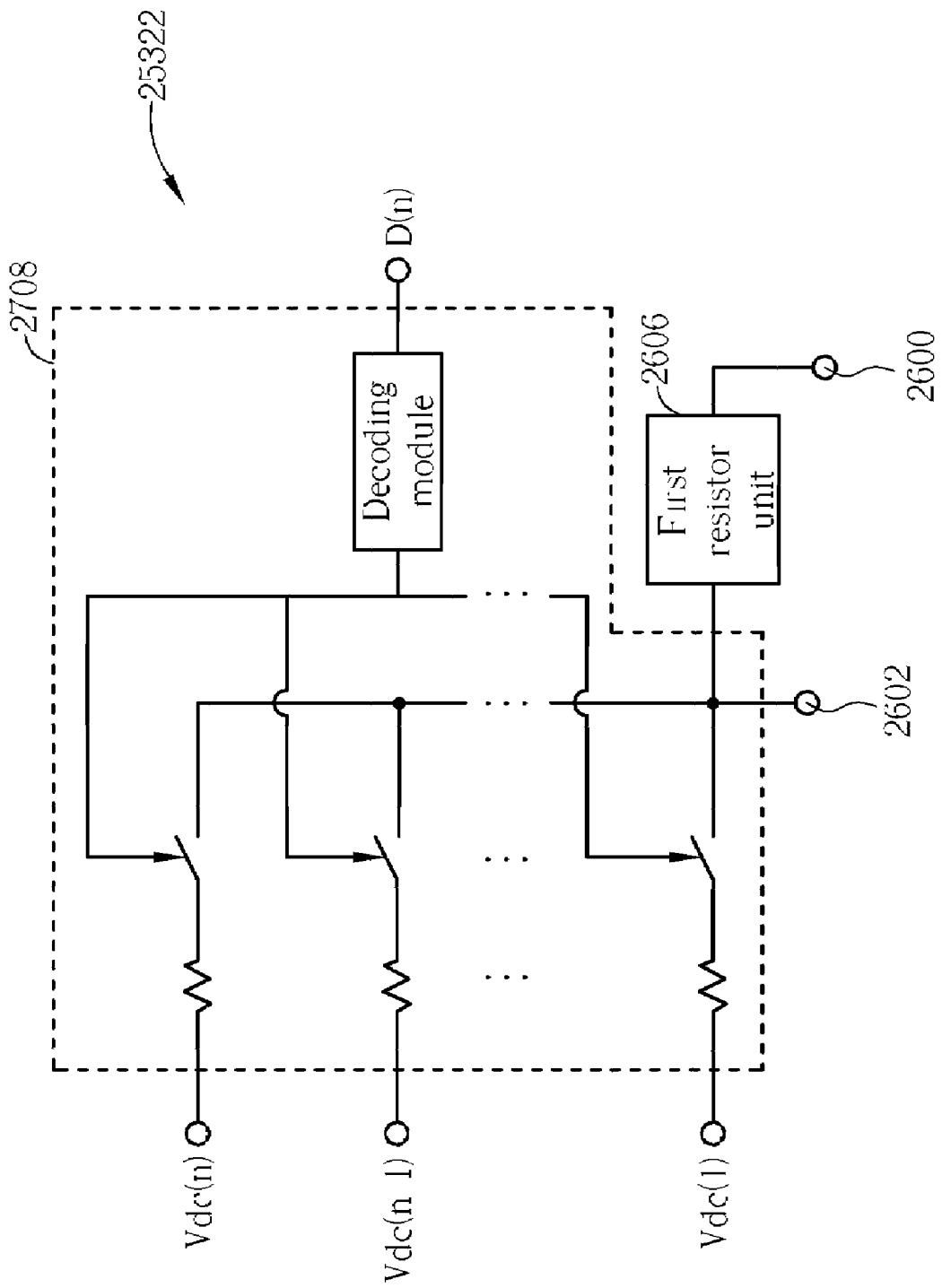
FIG. 27 is a schematic diagram of a gain selector according to FIG. 25.

Please refer to FIG. 25, which is a schematic diagram of a voltage conversion device 250 according to an embodiment of the present invention. The voltage conversion device 250 is used for converting an analog voltage Vi provided by an analog voltage source, which can be display data of a flat panel display. The structure of the voltage conversion device 250 is similar to that of the voltage conversion device 30, so that the same devices adopt the same labels. In the voltage conversion device 30, one end of the gain selector 322 is coupled to the ground, while in the voltage conversion device 250, one end of a gain selector 25322 changes to be coupled to DC voltages Vdc(1)~Vdc(n). Take FIG. 5 as an example, the resistor R50_1 changes to be couple to the DC voltage Vdc(1), . . . , the resistor R50_(n−1) changes to be couple to the DC voltage Vdc(n−1), and the resistor R50_n changes to be couple to the DC voltage Vdc(n). Please refer to FIG. 26, which is a schematic diagram of the gain selector 25322. The gain selector 25322 includes a first signal end 2600, a second signal end 2602, a first resistor unit 2606, and a resistance decision module 2608. The second signal end 2602 is coupled to the first input end 360 of the voltage output module 36, while the first signal end 2600 is coupled to the output end 364 of the voltage output module 36. Functions of the resistance decision module 2608 are similar to those of the resistance decision module 508 in FIG. 5, utilized for determining one DC voltage from the DC voltages Vdc(1)~Vdc(n) for the second signal end 2602 and a corresponding resistor from the resistors R260_1~R260_n by switch units SW260_1~SW260_n according to the digital signal D(n) outputted from the A/D converter 320. Certainly, as shown in FIG. 27, another resistance decision module 2708 can replace the resistance decision module 2608 and the cost of production can be decreased.

The operating principle of the voltage conversion device 250 is similar to that of the voltage conversion device 30, utilized for amplifying the input voltage Vi according to a gain determined by the gain selector via feedback. The dissimilarity of these two operating principles are as follows: in the voltage conversion device 30, one end of the gain selector 322 is coupled to the ground, while in the voltage conversion device 250, the gain selector 25322 changes to be coupled to the DC voltages Vdc(1)~Vdc(n). Besides, in the voltage conversion device 30, the output end of the voltage selection module 34 is coupled to the second input end 362 of the voltage output module 36, while in the voltage conversion device 250, the second input end 362 changes to be coupled to the input voltage Vi, so that the voltage selection module 34 is not needed. Therefore, those skills in the art can determine characteristics of each device according to expected voltage turning points, so as to determine an expected voltage gain for achieving a diagram of the gain curve as shown in FIG. 10.

In addition, as for the LCD, an inversion of polarity of output voltage also needs to be considered. Thus, according to the voltage conversion device 250, the present invention further provides a voltage conversion device for displaying data for a LCD.

Figure 28:
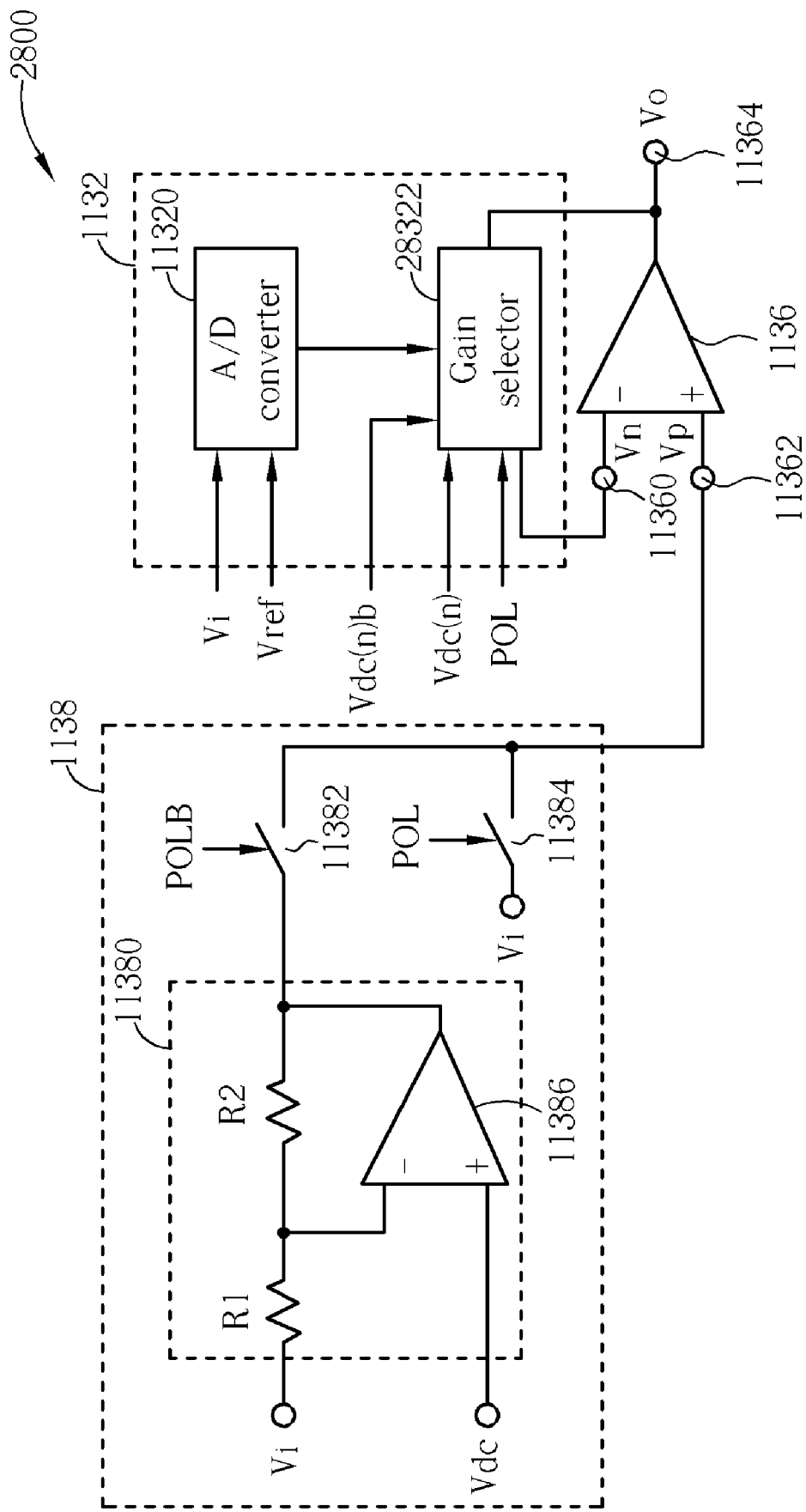
FIG. 28 is a schematic diagram of a voltage conversion device according to an embodiment of the present invention.
Figure 29:
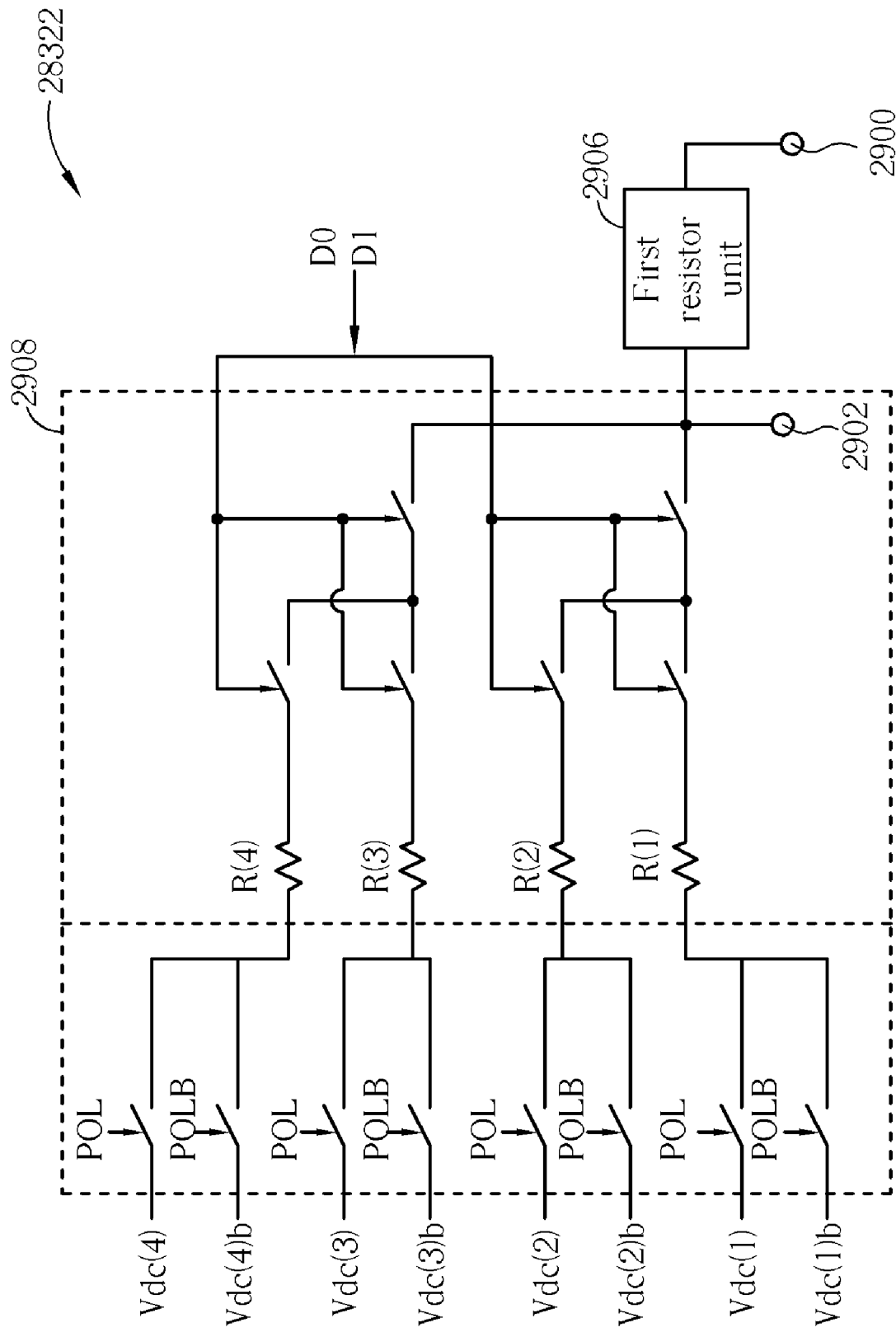
FIG. 29 is a schematic diagram of a gain selector according to FIG. 28.
Figure 30:
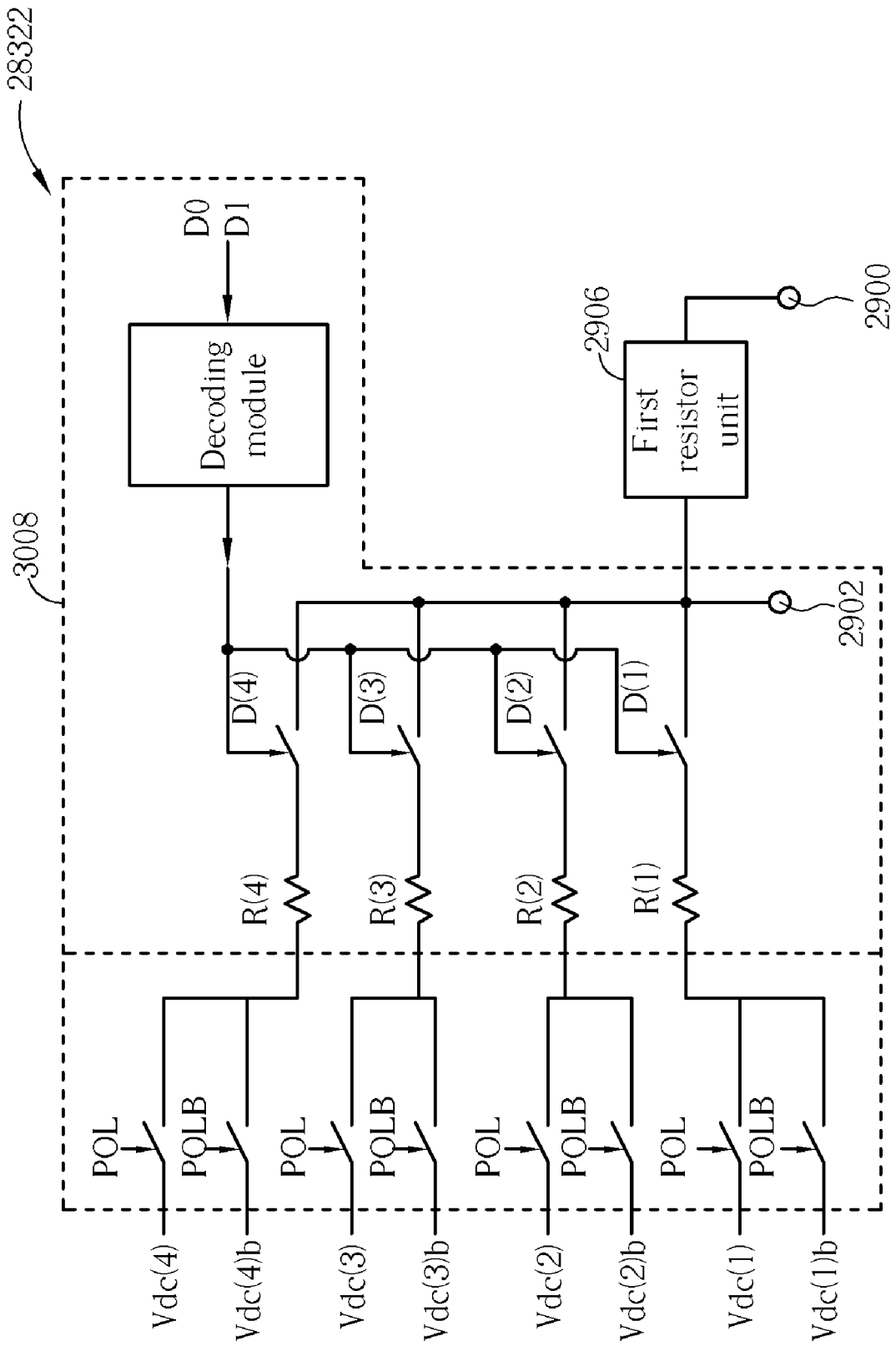
FIG. 30 is a schematic diagram of a gain selector according to FIG. 28.

Please refer to FIG. 28, which is a schematic diagram of a voltage conversion device 2800 according to an embodiment of the present invention. The voltage conversion device 2800 is used for converting the analog voltage Vi provided by an analog voltage source, which can be display data of an LCD. The structure of the voltage conversion device 2800 is similar to that of the voltage conversion device 1100, so that same devices adopt the same labels. In the voltage conversion device 1100, one end of the gain selector 11322 is coupled to the ground, while in the voltage conversion device 2800, a gain selector 28322 changes to be coupled to the polarity-selection signal and the DC voltages Vdc(1)~Vdc(n), Vdc(1)b~Vdc(n)b. Take FIG. 17 as an example, the resistor R(1) changes to be couple to a switch and the DC voltage Vdc(1)b and to a switch and the DC voltage Vdc(1). The resistor R(2) changes to be couple to a switch and the DC voltage Vdc(2)b and to a switch and the DC voltage Vdc(2). The resistor R(3) changes to be couple to a switch and the DC voltage Vdc(3)b and to a switch and the DC voltage Vdc(3). The resistor R(4) changes to be couple to a switch and the DC voltage Vdc(4)b and to a switch and the DC voltage Vdc(4). Please refer to FIG. 29, which is a schematic diagram of the gain selector 28322. The gain selector 28322 includes a first signal end 2900, a second signal end 2902, a first resistor unit 2906, and a resistance decision module 2908. The second signal end 2902 is coupled to the first input end 11360 of the voltage output module 1136, while the first signal end 2900 is coupled to the output end 11364 of the voltage output module 1136. Functions of the resistance decision module 2908 are similar to those of the resistance decision module 2106 in FIG. 21, which will not be narrated in details. Certainly, as shown in FIG. 30, another resistance decision module 3008 can replace the resistance decision module 2908 and the cost of production can be decreased.

The operating principle of the voltage conversion device 2800 is similar to that of the voltage conversion device 1100, utilized for transforming polarity of the input voltage Vi according to the polarity-selection signal POL and the inverse polarity-selection signal POLB and for amplifying the input voltage Vi according to a gain determined by the gain selector. The dissimilarity of these two operating principles are as follows: in the voltage conversion device 1100, one end of the gain selector 11322 is coupled to the ground, while in the voltage conversion device 2800, the gain selector 28322 changes to be coupled to the polarity-selection signal POL and the DC voltages Vdc(1)~Vdc(n), Vdc(1)b~Vdc(n)b. Besides, in the voltage conversion device 1100, the output end of the voltage selection module 1134 is coupled to the second input end 11362 of the voltage output module 1136, while in the voltage conversion device 2800, the second input end 11362 changes to be coupled to the output end of the voltage reception module 1138 so that the voltage selection module 1134 is not needed. Therefore, those skills in the art can determine characteristics of each device according to expected voltage turning points so as to determine an expected voltage gain for achieving diagrams of the gain curves as shown in FIG. 13 and FIG. 15. For example, in FIG. 12 and 13, if characteristics of the expected gain curve are as follows: V1=0.1V, Vx=0.2V, Vy=0.9V, V2=1V, Vo1=0.1V, Vox=1V, Voy=4V, and Vo2=4.9V. Then, in FIG. 16, set Vr(1)=0.1V, Vr(2)=0.2V, Vr(3)=0.9V, and Vr(4)=1V. In FIG. 28 and FIG. 29, connect the first signal end 2900 to the output end 11364 of the voltage output module 1136, and connect the second signal end 2902 to the first input end 11360 of the voltage output module 1136. Set R(1)=[(resistance of the first resistor unit 2906)/8](Ω), R(2)={[(resistance of the first resistor unit 2906)*7]/23}(Ω), and R(3)=[(resistance of the first resistor unit 2906)/8](Ω)

Besides, set Vdc(1)=(0.8/8)(V), Vdc(2)=(−0.1/2.3)(V), and Vdc(3)=(4.1/8)(V). Similarly, in FIG. 14 and FIG. 15, if characteristics of the expected gain curve are as follows: V1=0.1V, Vx=0.2V, Vy=0.9V, V2=1V, V1'=0.1V, Vx'=0.2V, Vy'=0.9V, V2'=1V, Vo1'=0.1V, Vox'=1V, Voy'=4V, and Vo2'=4.9V. Then, in FIG. 16, set Vr(1)=0.1V, Vr(2)=0.2V, Vr(3)=0.9V, and Vr(4)=1V. In FIG. 28 and FIG. 29, connect the first signal end 2900 to the output end 11364 of the voltage output module 1136, and connect the second signal end 2902 to the first input end 11360. Set R(1)=[(resistance of the first resistor unit 2906)/8](Ω), R(2)={[(resistance of the first resistor unit 2906)*7]/23}(Ω), and R(3)=[(resistance of the first resistor unit 2906)/8](Ω)

Meanwhile, set Vdc(1)b=(4.1/8)(V), Vdc(2)b=(−0.1/2.3)(V), and Vdc(3)b=(0.8/8)(V). Besides, in FIG. 28, set R1/R2=1, Vdc=1.1V. Similarly, difference between FIG. 14 and 15 and between FIG. 12 and 13 is that the input voltages V1, Vx, Vy, V2 in FIG. 12 are passed through the polarity inversion module 11380 in FIG. 28 in advanced and transformed to corresponding voltages V2', Vy', Vx', V1' in FIG. 14, and then the gain decision module 1132 of the voltage conversion device 2800 determines which gain of the voltage output module 1136 to output and how much shift of the output voltage Vo is.

In summary, the present invention can adjust the output gain by controlling numbers and values of elements in the voltage conversion device, so that the present invention has different gains related to different input voltage. Furthermore, the present invention can output the output voltage with alternate positive and negative polarities according to the polarity-selection signal. Therefore, when the present invention voltage conversion device is used for converting display data of an LCD, the characteristic of the gray level displayed by the LCD can fit identification ability of human eyes and liquid crystals of the LCD is driven by means of voltages with alternate positive and negative polarities, performing nature images for users, so as to prevent residual image effect and liquid crystal breakage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage conversion device having a non-linear gain for converting analog voltage provided by an analog voltage source, the voltage conversion device comprising:
   a gain decision module comprising:
      an analog to digital (A/D) converter coupled to the analog voltage source, for converting analog voltage provided by the analog voltage source into digital signals; and
      a gain selector coupled to the A/D converter, for determining a gain according to the digital signals outputted from the A/D converter;
   a voltage reception module for receiving analog voltage provided by the analog voltage source and outputting the analog voltage after transforming a polarity of the analog voltage according to a polarity-selection signal;
   a voltage selection module coupled to the voltage reception module and the A/D converter, for outputting a direct-current (DC) voltage selected from a plurality of DC voltages according to an outputted voltage of the voltage reception module, the digital signals outputted from the A/D converter, and the polarity-selection signal; and
   a voltage output module having a first input end coupled to the gain selector, an output end coupled to the gain selector, and a second input end coupled to the voltage selection module, for outputting an amplified result of the DC voltage outputted from the voltage selection module according to the gain determined by the gain selector.

2. The voltage conversion device of claim 1, wherein the A/D converter comprises:
   a plurality of comparators each having a first input end coupled to the analog voltage source, a second input end coupled to a reference voltage source and an output end, for outputting a comparison result between voltages of the first input end and the second input end; and
   a digital decoding circuit coupled to the plurality of comparators, for outputting digital signals according to the comparison result outputted from the plurality of comparators.

3. The voltage conversion device of claim 1, wherein the gain selector comprises:
   a first signal end;
   a second signal end coupled to the first input end of the voltage output module;
   a third signal end;
   a first resistor unit coupled between the first signal end and the second signal end; and
   a resistance decision module coupled to the A/D converter and between the second signal end and the third signal end, for determining resistance between the second signal end and the third signal end according to the digital signals outputted from the A/D converter.

4. The voltage conversion device of claim 3, wherein the resistance decision module comprises:
   a plurality of resistors coupled to the third signal end; and
   a plurality of switch units each coupled to the A/D converter and between a resistor of the plurality of resistors and the second signal end, for conducting or cutting off a connection between the resistor and the second signal end according to the digital signals outputted from the A/D converter.

5. The voltage conversion device of claim 3, wherein the resistance decision module comprises:
   a decoding module coupled to the A/D converter, for decoding the digital signals outputted from the A/D converter;
   a plurality of resistors coupled to the second signal end; and
   a plurality of switch units each coupled to the decoding module and between a resistor of the plurality of resistors and the third signal end, for conducting or cutting off a connection between the resistor and the third signal end according to a decoded result outputted from the decoding module.

6. The voltage conversion device of claim 3, wherein the first signal end is coupled to a system ground end, and the third end is coupled to the output end of the voltage output module.

7. The voltage conversion device of claim 3, wherein the first signal end is coupled to the output end of the voltage output module, and the third end is coupled to a system ground end.

8. The voltage conversion device of claim 1, wherein the voltage reception module comprises:
   a first switch unit coupled between the voltage selection module and the analog voltage source, for conducting or cutting off a connection between the voltage selection module and the analog voltage source according to the polarity-selection signal;
   a polarity-inversion module coupled to the analog voltage source, for inverting a polarity of analog voltage provided by the analog voltage source; and
   a second switch unit coupled between the polarity-inversion module and the voltage selection module, for conducting or cutting off a connection between the polarity-inversion module and the voltage selection module according to the polarity-selection signal.

9. The voltage conversion device of claim 8, wherein the polarity-inversion module comprises:
   a first resistor coupled to the analog voltage source;
   a second resistor coupled between the first resistor and the second switch unit; and
   an optional amplifier having a first input end coupled between the first resistor and the second resistor, a second input end coupled to a DC voltage source, and an output end coupled between the second resistor and the second switch unit.

10. The voltage conversion device of claim 1, wherein the voltage selection module comprises:
    a first resistor unit coupled between the analog voltage source and the second input end of the voltage output module;
    a resistance decision module; and
    a plurality of first switch units each coupled to the resistance decision module and the plurality of DC voltage sources, for conducting or cutting off a connection between one of the plurality of DC voltage sources and the resistance decision module according to a polarity-selection signal;

wherein the resistance decision module is coupled to the A/D converter and between the second end of the voltage output module and the plurality of first switch units, for determining resistance between one of the plurality of first switch units and the second input end of the voltage output module according to the digital signals outputted from the A/D converter.

11. The voltage conversion device of claim 10, wherein the resistance decision module comprises:

a plurality of resistors each coupled to two of the plurality of first switch units; and a plurality of second switch units each coupled to the A/D converter and between a resistor of the plurality of resistors and the second input end of the voltage output module, for conducting or cutting off a connection between the resistor and the second input end of the voltage output module according to the digital signals outputted from the A/D converter.

12. The voltage conversion device of claim 10, wherein the resistance decision module comprises:

a decoding module coupled to the A/D converter, for decoding the digital signals outputted from the A/D converter;

a plurality of resistors each coupled to two of the plurality of first switch units; and a plurality of second switch units each coupled to the decoding module and between a resistor of the plurality of resistors and the second input end of the voltage output module, for conducting or cutting off a connection between the resistor and the second input end of the voltage output module according to a decoded result outputted from the decoding module.

13. The voltage conversion device of claim 1, wherein the voltage output module is an operational amplifier.

14. The voltage conversion device of claim 1, wherein the analog voltage source is display data of a flat panel display.

15. A voltage conversion device having a non-linear gain for converting analog voltage provided by an analog voltage source, the voltage conversion device comprising:

a gain decision module comprising:

an analog to digital (A/D) converter coupled to the analog voltage source, for converting analog voltage provided by the analog voltage source into digital signals; and a gain selector coupled to the A/D converter, for determining a gain according to the digital signals outputted from the A/D converter; and a voltage output module comprising a first input end coupled to the gain selector, an output end coupled to the gain selector, and a second input end coupled to the analog voltage source, for outputting an amplified result of analog voltage provided by the analog voltage source according to the gain determined by the gain selector.

16. The voltage conversion device of claim 15, wherein the A/D converter comprises:

a plurality of comparators, each having a first input end coupled to the analog voltage source, a second input end coupled to a reference voltage source and an output end, for outputting a comparison result between voltages of the first input end and the second input end; and a digital decoding circuit coupled to the plurality of comparators, for outputting digital signals according to the comparison result outputted from the plurality of comparators.

17. The voltage conversion device of claim 15, wherein the gain selector comprises:

a first signal end coupled to the output end of the voltage output module;

a second signal end coupled to the first input end of the voltage output module;

a first resistor unit coupled between the first signal end and the second signal end; and a resistance decision module coupled to the A/D converter and between the second signal end and a plurality of DC voltage sources, utilized for determining resistance between the second signal end and one of the plurality of DC voltage sources according to the digital signals outputted from the A/D converter.

18. The voltage conversion device of claim 17, wherein the resistance decision module comprises:

a plurality of resistors each coupled to one of the plurality of DC voltage sources; and a plurality of switch units each coupled to the A/D converter and between a resistor of the plurality of resistors and the second signal end, for conducting or cutting off a connection between the resistor and the second signal end according to the digital signals outputted from the A/D converter.

19. The voltage conversion device of claim 17, wherein the resistance decision module comprises:

a decoding module coupled to the A/D converter, for decoding the digital signals outputted from the A/D converter;

a plurality of resistors each coupled to one of the plurality of DC voltage sources; and a plurality of switch units each coupled to the decoding module and between a resistor of the plurality of resistors and the second signal end, for conducting or cutting off a connection between the resistor and the second signal end according to a decoded result outputted from the decoding module.

20. The voltage conversion device of claim 15, wherein the voltage output module is an operational amplifier.

21. The voltage conversion device of claim 15, wherein the analog voltage source is display data of a flat panel display.

22. A voltage conversion device having a non-linear gain, for converting analog voltage provided by an analog voltage source, the voltage conversion device comprising:

a gain decision module comprising:

an analog to digital (A/D) converter coupled to the analog voltage source, for converting analog voltage provided by the analog voltage source into digital signals; and a gain selector coupled to the A/D converter, for determining a gain according to the digital signals outputted from the A/D converter;

a voltage reception module for receiving analog voltage provided by the analog voltage source and outputting the analog voltage after transforming a polarity of the analog voltage according to a polarity-selection signal; and a voltage output module having a first input end coupled to the gain selector, an output end coupled to the gain selector, and a second input end coupled to the voltage reception module, utilized for outputting an amplified result of the analog voltage outputted from the voltage reception module according to the gain determined by the gain selector.

23. The voltage conversion device of claim 22, wherein the A/D converter comprises:

a plurality of comparators each having a first input end coupled to the analog voltage source, a second input end coupled to a reference voltage source, and an output end, for outputting a comparison result between voltages of the first input end and the second input end; and a digital decoding circuit coupled to the plurality of comparators, for outputting digital signals according to the comparison result outputted from the plurality of comparators.

24. The voltage conversion device of claim 22, wherein the gain selector comprises:
a first signal end coupled to the output end of the voltage output module;
a second signal end coupled to the first input end of the voltage output module;
a first resistor unit coupled between the first signal end and the second signal end;
a resistance decision module; and
a plurality of first switch units each coupled to the resistance decision module and the plurality of DC voltage sources, for conducting or cutting off a connection between one of the plurality of DC voltage sources and the resistance decision module according to the polarity-selection signal;
wherein the resistance decision module is coupled to the A/D converter and between the second end of the voltage output module and the plurality of first switch units, for determining resistance between one of the plurality of first switch units and the second input end of the voltage output module according to the digital signals outputted from the A/D converter.

25. The voltage conversion device of claim 24, wherein the resistance decision module comprises:
a plurality of resistors each coupled to two of the plurality of first switch units; and
a plurality of second switch units each coupled to the A/D converter and between a resistor of the plurality of resistors and the second signal end, for conducting or cutting off a connection between the resistor and the second signal end according to the digital signals outputted from the A/D converter.

26. The voltage conversion device of claim 24, wherein the resistance decision module comprises:
a decoding module coupled to the A/D converter, for decoding the digital signals outputted from the A/D converter;
a plurality of resistors each coupled to two of the plurality of first switch units; and
a plurality of second switch units each coupled to the decoding module and between a resistor of the plurality of resistors and the second signal end, for conducting or cutting off a connection between the resistor and the second signal end according to a decoded result outputted from the decoding module.

27. The voltage conversion device of claim 22, wherein the voltage reception module comprises:
a first switch unit coupled between the analog voltage source and the second input end of the voltage output module, for conducting or cutting off a connection between the analog voltage source and the second input end of the voltage output module according to the polarity-selection signal;
a polarity-inversion module coupled to the analog voltage source, for inverting a polarity of analog voltage provided by the analog voltage source; and
a second switch unit coupled between the polarity-inversion module and the second input end of the voltage output module, for conducting or cutting off a connection between the polarity-inversion module and the second input end of the voltage output module according to the polarity-selection signal.

28. The voltage conversion device of claim 27, wherein the polarity-inversion module comprises:
a first resistor coupled to the analog voltage source;
a second resistor coupled between the first resistor and the second switch unit; and
an optional amplifier having a first input end coupled between the first resistor and the second resistor, a second input end coupled to a DC voltage source, and an output end coupled between the second resistor and the second switch unit.

29. The voltage conversion device of claim 22, wherein the voltage output module is an operational amplifier.

30. The voltage conversion device of claim 22, wherein the analog voltage source is display data of a flat panel display.

31. A voltage conversion device having a non-linear gain for converting analog voltage provided by an analog voltage source, the voltage conversion device comprising:
a gain decision module comprising:
an analog to digital (A/D) converter coupled to the analog voltage source, for converting analog voltage provided by the analog voltage source into digital signals; and
a gain selector coupled to the A/D converter, for determining a gain according to the digital signals outputted from the A/D converter;
a voltage selection module coupled to the analog voltage source and the A/D converter, for outputting a direct-current (DC) voltage selected from a plurality of DC voltages according to analog voltage provided by the analog voltage source and the digital signals outputted from the A/D converter; and
a voltage output module having a first input end coupled to the gain selector, an output end coupled to the gain selector, and a second input end coupled to the voltage selection module, for outputting an amplified result of the DC voltage outputted from the voltage selection module according to the gain determined by the gain selector.

32. The voltage conversion device of claim 31, wherein the A/D converter comprises:
a plurality of comparators each having a first input end coupled to the analog voltage source, a second input end coupled to a reference voltage source and an output end, for outputting a comparison result between voltages of the first input end and the second input end; and
a digital decoding circuit coupled to the plurality of comparators, for outputting digital signals according to the comparison result outputted from the plurality of comparators.

33. The voltage conversion device of claim 31, wherein the gain selector comprises:
a first signal end;
a second signal end coupled to the first input end of the voltage output module;
a third signal end;
a first resistor unit coupled between the first signal end and the second signal end; and
a resistance decision module coupled to the A/D converter and between the second signal end and the third signal end, for determining resistance between the second signal end and the third signal end according to the digital signals outputted from the A/D converter.

34. The voltage conversion device of claim 33, wherein the resistance decision module comprises:
a plurality of resistors coupled to the third signal end; and a plurality of switch units each coupled to the A/D converter and between a resistor of the plurality of resistors and the second signal end, for conducting or cutting off a connection between the resistor and the second signal end according to the digital signals outputted from the A/D converter.

35. The voltage conversion device of claim 33, wherein the resistance decision module comprises:
a decoding module coupled to the A/D converter, for decoding the digital signals outputted from the A/D converter;
a plurality of resistors coupled to the second signal end; and
a plurality of switch units, each coupled to the decoding module and between a resistor of the plurality of resistors and the third signal end, for conducting or cutting off a connection between the resistor and the third signal end according to a decoded result outputted from the decoding module.

36. The voltage conversion device of claim 33, wherein the first signal end is coupled to a system ground end, and the third end is coupled to the output end of the voltage output module.

37. The voltage conversion device of claim 33, wherein the first signal end is coupled to the output end of the voltage output module, and the third end is coupled to a system ground end.

38. The voltage conversion device of claim 31, wherein the voltage selection module comprises:
a first resistor unit coupled between the analog voltage source and the second input end of the voltage output module; and
a resistance decision module coupled to the A/D converter and between the second end of the voltage output module and a plurality of DC voltage sources, for determining resistance between one of the plurality of DC voltage sources and the second input end of the voltage output module according to the digital signals outputted from the A/D converter.

39. The voltage conversion device of claim 38, wherein the resistance decision module comprises:
a plurality of resistors each coupled to one of the plurality of DC voltage sources; and
a plurality of switch units each coupled to the A/D converter and between a resistor of the plurality of resistors and the second input end of the voltage output module, for conducting or cutting off a connection between the resistor and the second input end of the voltage output module according to the digital signals outputted from the A/D converter.

40. The voltage conversion device of claim 38, wherein the resistance decision module comprises:
a decoding module coupled to the A/D converter, for decoding the digital signals outputted from the A/D converter;
a plurality of resistors each coupled to one of the plurality of DC voltage sources; and
a plurality of switch units each coupled to the decoding module and between a resistor of the plurality of resistors and the second input end of the voltage output module, for conducting or cutting off a connection between the resistor and the second input end of the voltage output module according to a decoded result outputted from the decoding module.

41. The voltage conversion device of claim 31, wherein the voltage output module is an operational amplifier.

42. The voltage conversion device of claim 31, wherein the analog voltage source is display data of a flat panel display.

* * * * *